United States Patent
Chang et al.

(10) Patent No.: US 11,705,516 B2
(45) Date of Patent: Jul. 18, 2023

(54) POLARIZATION ENHANCEMENT STRUCTURE FOR ENLARGING MEMORY WINDOW

(71) Applicant: Taiwan Semiconductor Manufacturing Co., Ltd., Hsinchu (TW)

(72) Inventors: Chih-Yu Chang, New Taipei (TW); Mauricio Manfrini, Zhubei (TW); Hung Wei Li, Hsinchu (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/218,680

(22) Filed: Mar. 31, 2021

(65) Prior Publication Data

US 2022/0223741 A1 Jul. 14, 2022

Related U.S. Application Data

(60) Provisional application No. 63/135,109, filed on Jan. 8, 2021.

(51) Int. Cl.
*H01L 29/78* (2006.01)
*H01L 29/51* (2006.01)
(Continued)

(52) U.S. Cl.
CPC ........ *H01L 29/78391* (2014.09); *H01L 29/24* (2013.01); *H01L 29/516* (2013.01); *H01L 29/6684* (2013.01); *H01L 29/66969* (2013.01)

(58) Field of Classification Search
None
See application file for complete search history.

(56) References Cited

U.S. PATENT DOCUMENTS

2004/0061153 A1 4/2004 Misewich et al.
2006/0118844 A1 6/2006 Kijima et al.
(Continued)

FOREIGN PATENT DOCUMENTS

| JP | 2004119970 A | 4/2004 |
|---|---|---|
| JP | 2013093482 A | 5/2013 |
| KR | 20060063733 A | 6/2006 |

OTHER PUBLICATIONS

Rad, Reza M. "Ferroelectric Field Effect Transistors" Nanoelectronics and Information Technology, pp. 387-403, published in 2007.
(Continued)

*Primary Examiner* — Vincent Wall
(74) *Attorney, Agent, or Firm* — Eschweiler & Potashnik, LLC

(57) ABSTRACT

The present disclosure relates a ferroelectric field-effect transistor (FeFET) device. The FeFET device includes a ferroelectric structure having a first side and a second side. A gate structure is disposed along the first side of the ferroelectric structure, and an oxide semiconductor is disposed along the second side of the ferroelectric structure. The oxide semiconductor has a first semiconductor type. A source region and a drain region are disposed on the oxide semiconductor. The gate structure is laterally between the source region and the drain region. A polarization enhancement structure is arranged on the oxide semiconductor between the source region and the drain region. The polarization enhancement structure includes a semiconductor material or an oxide semiconductor material having a second semiconductor type that is different than the first semiconductor type.

20 Claims, 15 Drawing Sheets

(51) Int. Cl.
  *H01L 29/66*  (2006.01)
  *H01L 29/24*  (2006.01)

(56) References Cited

U.S. PATENT DOCUMENTS

| | | | |
|---|---|---|---|
| 2016/0307777 A1* | 10/2016 | Kurata | H01L 27/1207 |
| 2018/0286987 A1 | 10/2018 | Lee et al. | |
| 2020/0176457 A1 | 6/2020 | Sharma et al. | |
| 2021/0313439 A1* | 10/2021 | Lee | H01L 29/4908 |
| 2021/0398899 A1* | 12/2021 | Li | H01L 23/5226 |
| 2021/0399100 A1* | 12/2021 | Li | H01L 29/24 |
| 2021/0399136 A1* | 12/2021 | Vellianitis | H01L 21/383 |
| 2021/0399139 A1* | 12/2021 | Li | H01L 29/66742 |

OTHER PUBLICATIONS

Merkel, Jordan. "FeFET Process Integration and Characterization" 37th Annual Microelectronic Engineering Conference, published Apr. 2019.

Park et al. "Review of ferroelectric field-effect transistors for three-dimensional storage applications" Nano Select 2021;1-21, published on Jan. 7, 2021.

* cited by examiner

POLARIZATION ENHANCEMENT STRUCTURE FOR ENLARGING MEMORY WINDOW

REFERENCE TO RELATED APPLICATION

This Application claims the benefit of U.S. Provisional Application No. 63/135,109, filed on Jan. 8, 2021, the contents of which are hereby incorporated by reference in their entirety.

BACKGROUND

Many modern day electronic devices include non-volatile memory. Non-volatile memory is electronic memory that is able to store data when powered and also in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
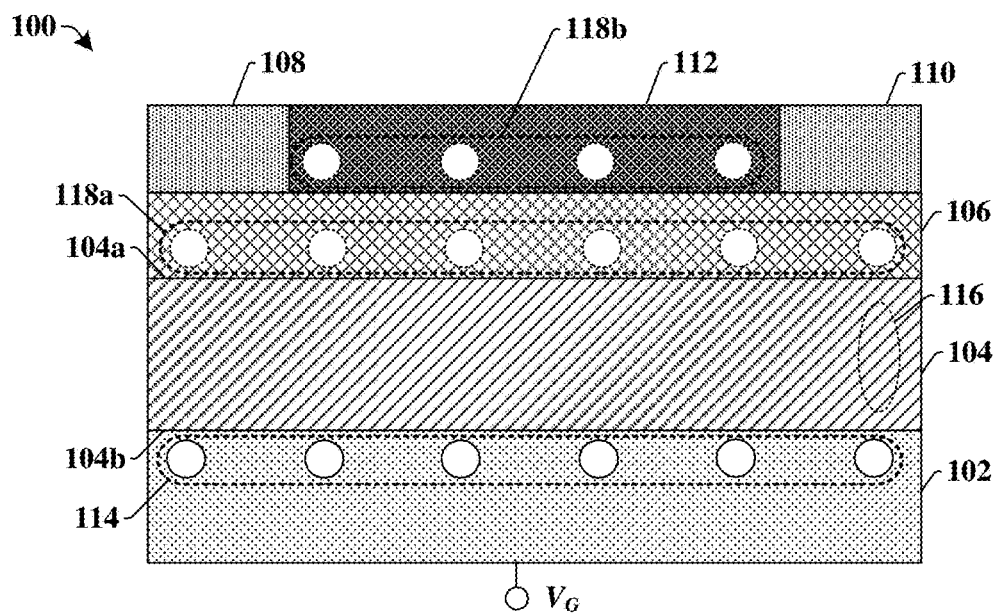
FIG. 1 illustrates a cross-sectional view of some embodiments of a ferroelectric field-effect transistor (FeFET) device having a polarization enhancement structure configured to enlarge a memory window.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric field-effect transistor (FeFET) device is a type of ferroelectric random access memory (FeRAM) device comprising a ferroelectric material arranged between a conductive gate structure and a channel region disposed between a source region and a drain region. During operation of a FeFET device, an application of a gate voltage to the gate structure will generate an electric field that causes a dipole moment to form within the ferroelectric material. Depending on a value of the gate voltage, a direction of the dipole moment (i.e., a polarization) may be in one of two opposing directions. Since a threshold voltage (e.g., a minimum gate-to-source voltage that forms a conductive path between the source region and the drain region) of a FeFET device is dependent upon the polarization within the ferroelectric material, the different polarizations effectively split the threshold voltage of the FeFET device into two distinct values corresponding to different data states.

For example, in an n-type FeFET (e.g., a FeFET device having a channel region with an n-type doping) a positive gate voltage will form an electric field that gives a ferroelectric material a first polarization pointing towards the channel region and that causes electrons to accumulate within the channel region. The electrons will reinforce the first polarization within the ferroelectric material and give the FeFET device a first threshold voltage corresponding to a first data state (e.g., a logical "1"). Alternatively, a negative gate voltage will form an electric field that gives the ferroelectric material a second polarization pointing towards the gate structure and that causes holes to accumulate within the channel region. The holes will reinforce the second polarization within the ferroelectric material and give the FeFET device a second threshold voltage corresponding to a second data state (e.g., a logical "0"). The difference between the first threshold value and the second threshold value defines a memory window of the FeFET device (e.g., corresponding to a difference of threshold voltages of the first and second data states).

The channel region of a FeFET device may be a semiconductor material (e.g., silicon, germanium, etc.). However, it has been appreciated that using an oxide semiconductor as a channel region of a FeFET device allows for the FeFET device to achieve a good performance (e.g., a high endurance, low access times, etc.). It has also been appreciated that a memory window of a FeFET device using an oxide semiconductor is relatively small. This is because an oxide semiconductor is not able to accumulate large numbers of different types of charge carriers (e.g., holes and electrons). For example, while a channel region comprising an n-type oxide semiconductor can accumulate electrons to reinforce a polarization within a ferroelectric material when a positive gate voltage is applied to a gate structure, the n-type oxide semiconductor cannot also accumulate holes to reinforce a polarization within the ferroelectric material when a negative gate voltage is applied to the gate structure. Therefore, a negative gate voltage applied to the gate structure will cause the ferroelectric material to polarize, however when the negative gate voltage is removed the ferroelectric material will revert to a remnant polarization. The remnant polarization will reduce a memory window of the FeFET device (e.g., to about half that of a FeFET device having a channel region that is a semiconductor material).

The present disclosure, in some embodiments, relates to an integrated chip having a FeFET device comprising a polarization enhancement structure configured to increase a memory window. In some embodiments, the integrated chip comprises a gate structure arranged on a first side of a ferroelectric material and an oxide semiconductor comprising a first semiconductor type (e.g., an n-type semiconductor) arranged along an opposing second side of the ferroelectric material. A source region and/or a drain region are arranged on the oxide semiconductor, and a polarization enhancement structure comprising a second semiconductor type (e.g., a p-type semiconductor) is arranged on the oxide semiconductor (e.g., between the source region and the drain region). During operation, the gate structure is configured to generate an electric field that polarizes the ferroelectric material. When the electric field causes the ferroelectric material to have a first polarization with a first direction, a first type of charge carriers accumulate within the oxide semiconductor and enhance and/or reinforce the first polarization. When the electric field causes the ferroelectric material to have a second polarization with a second direction, a second type of charge carriers will not accumulate within the oxide semiconductor, however a second type of charge carriers within the polarization enhancement structure will operate to enhance and/or reinforce the second polarization. By utilizing the second type of charge carriers within the polarization enhancement structure to enhance and/or reinforce the second polarization, a difference in threshold voltages between different data states will increase thereby giving the FeFET device a larger memory window.

FIG. 1 illustrates a cross-sectional view of some embodiments of a ferroelectric field-effect transistor (FeFET) device 100 having a polarization enhancement structure configured to enlarge a memory window.

The FeFET device 100 comprises a ferroelectric structure 104 having a first side 104a and a second side 104b. An oxide semiconductor 106 is arranged along the first side 104a of the ferroelectric structure 104. The oxide semiconductor 106 comprises a first semiconductor type (e.g., an n-type semiconductor). A source region 108 and a drain region 110 are also arranged on the first side 104a of the ferroelectric structure 104 and are separated from the ferroelectric structure 104 by the oxide semiconductor 106. A gate structure 102 is arranged along the second side 104b of the ferroelectric structure 104. In some embodiments, the gate structure 102 may be at least in-part laterally between the source region 108 and the drain region 110.

A polarization enhancement structure 112 is arranged on the oxide semiconductor 106. In some embodiments, the polarization enhancement structure 112 may be arranged between the source region 108 and the drain region 110. In some such embodiments, the polarization enhancement structure 112 continuously extends between a first sidewall contacting the source region 108 and a second sidewall contacting the drain region 110. The polarization enhancement structure 112 comprises and/or is a semiconductor (e.g., a semiconductor material or an oxide semiconductor material) having a second semiconductor type (e.g., a p-type semiconductor) that is different than the first semiconductor type. For example, in some embodiments, the oxide semiconductor 106 comprises an n-type semiconductor (e.g., a semiconductor having free electrons outnumbering holes) while the polarization enhancement structure 112 comprises a p-type semiconductor (e.g., a semiconductor having holes outnumbering free electrons). In other embodiments, the oxide semiconductor 106 comprises a p-type semiconductor while the polarization enhancement structure 112 comprises an n-type semiconductor.

During operation, a gate voltage $V_G$ is applied to the gate structure 102. The gate voltage $V_G$ causes a first type of charge carriers 114 to accumulate along a surface of the gate structure 102 facing the ferroelectric structure 104. The first type of charge carriers 114 (e.g., holes or electrons) form an electric field that causes the ferroelectric structure 104 to be polarized to have a polarization 116. Depending on a value of the gate voltage $V_G$, the polarization 116 within the ferroelectric structure 104 may be different. For example, a positive gate voltage $V_G$ may result in a first polarization that represents a first data state (e.g., a "0"), while a negative gate voltage $V_G$ may result in a second polarization that represents a second data state (e.g., a "1").

The electric field will also cause a second type of charge carriers, 118a or 118b, (e.g., electrons or holes) to build up in either the oxide semiconductor 106 or in the polarization enhancement structure 112. The second type of charge carriers, 118a or 118b, will reinforce the polarization 116 within the ferroelectric structure 104. For example, when the ferroelectric layer 104 has a first polarization, the electric field may cause a second type of charge carriers 118a to build up in the oxide semiconductor 106 and reinforce the first polarization. However, when the ferroelectric layer 104 has a second polarization, the electric field may not be able to cause a second type of charge carriers 118a to build up in the oxide semiconductor 106. Because the electric field may not be able to cause the second type of charge carriers 118a to build up within the oxide semiconductor 106, charge carriers within the oxide semiconductor 106 will not have a significant effect on the second polarization. However, the electric field may cause a second type of charge carriers 118b to build up along a lower surface of the polarization enhancement structure 112 and to reinforce the second polarization. By having the second type of charge carriers 118b within the polarization enhancement structure 112 reinforce the second polarization, a difference between threshold voltages representing different data states increases and an associated memory window of the FeFET device 100 increases.

FIGS. 2A-2D illustrate cross-sectional views showing exemplary operations of an n-type FeFET device (e.g., a FeFET device having a channel region comprising an n-type oxide semiconductor).

Figures 2A, 2B:
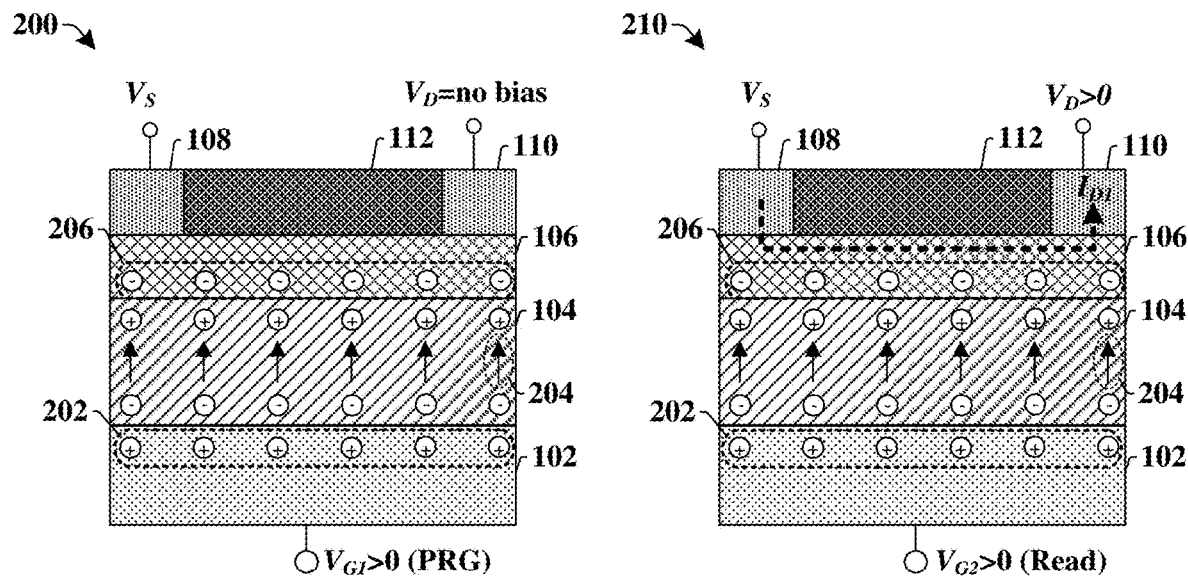
FIGS. 2A-2D illustrate cross-sectional views showing some embodiments of operations of a FeFET device having a polarization enhancement structure.

As shown in cross-sectional views 200 of FIG. 2A and cross-sectional view 210 of FIG. 2B, the n-type FeFET device comprises a ferroelectric structure 104 arranged between a gate structure 102 and an oxide semiconductor 106 comprising an n-type oxide semiconductor. A source region 108 and a drain region 110 are arranged on the oxide semiconductor 106. A polarization enhancement structure 112 comprising a p-type semiconductor is also arranged on the oxide semiconductor 106 between the source region 108 and the drain region 110.

As shown in cross-sectional view 200 of FIG. 2A, during a program (PRG) operation a positive gate voltage $V_{G1}$ is applied to the gate structure 102, while no bias is applied to the drain region 110 (e.g., $V_D=0$ or $V_D$=floating). The positive gate voltage $V_{G1}$ causes positive charge carriers 202 (i.e., holes) to accumulate upon a surface of the gate structure 102 facing the ferroelectric structure 104. The positive charge carriers 202 form an electric field that causes the ferroelectric structure 104 to be polarized to a first polarization 204 corresponding to a first data state (e.g., a "1"). The electric field further causes a build-up of negative charge carriers 206 within the oxide semiconductor 106. The negative charge carriers 206 reinforce the first polarization 204 within the ferroelectric structure 104, thereby giving the FeFET device a first threshold voltage. The positive charge carriers 202 within the ferroelectric structure 104 also may push away positive charge carriers within the polarization enhancement structure 112, thereby depleting the polarization enhancement structure 112 and preventing current from flowing within the polarization enhancement structure 112.

As shown in cross-sectional view 210 of FIG. 2B, during a read operation a positive gate voltage $V_{G2}$ is applied to the gate structure 102 and a drain voltage $V_D$ is applied to the drain region 110. The positive gate voltage $V_{G2}$ and the drain voltage $V_D$ cause a first drain current $I_{D1}$ to flow between the source region 108 and the drain region 110 and to a read circuit (e.g., a sense amplifier) (not shown), which is configured to read the first data state from the FeFET device. The first drain current $I_{D1}$ has a first value that depends upon the first threshold voltage (and thus the first polarization 204) of the FeFET device. In various embodiments, the read circuit may be coupled to the source region 108 or the drain region 110. In some embodiments, the drain voltage $V_D$ may be a positive voltage. In some such embodiments, a source voltage $V_S$ that is greater than or equal to 0 volts may be applied to the source region 108. In some embodiments, the source voltage $V_S$ may be greater than the drain voltage $V_D$, while in other embodiments the source voltage $V_S$ may be less than the drain voltage $V_D$. In some embodiments, the positive gate voltage $V_{G2}$ may be greater than or equal to the drain voltage $V_D$. In yet other embodiments (not shown), the drain voltage $V_D$ may be a negative voltage. In some such embodiments, a source voltage $V_S$ that is greater than the drain voltage (e.g., approximately equal to 0 V, greater than 0 V, etc.) may be applied to the source region 108.

Figure 2C:
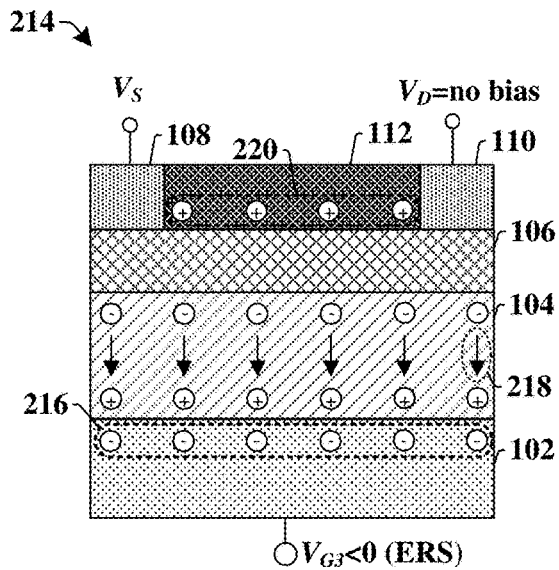

As shown in cross-sectional view 214 of FIG. 2C, during an erase (ERS) operation a negative gate voltage $V_{G3}$ is applied to the gate structure 102, while no bias is applied to the drain region 110 (e.g., $V_D=0$ or $V_D$=floating). The negative gate voltage $V_{G3}$ causes negative charge carriers 216 to accumulate along a surface of the gate structure 102 facing the ferroelectric structure 104. The negative charge carriers 216 form an electric field that causes the ferroelectric structure 104 to be polarized to a second polarization 218 corresponding to a second data state (e.g., a logical "0"). The electric field further reduces a build-up of negative charge carriers within the oxide semiconductor 106, but will not cause an accumulation of positive charge carriers within the oxide semiconductor 106. Rather, the electric field will cause positive charge carriers 220 to accumulate along a bottom of the polarization enhancement structure 112. The positive charge carriers 220 reinforce the second polarization 218 within the ferroelectric structure 104, thereby giving the FeFET device a second threshold voltage.

Figure 2D:
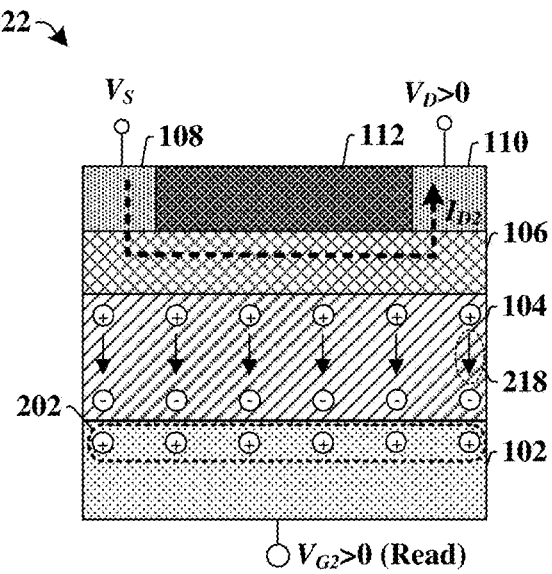

As shown in cross-sectional view 222 of FIG. 2D, during a read operation a positive gate voltage $V_{G2}$ is applied to the gate structure 102 and a drain voltage $V_D$ is applied to the drain region 110. The positive gate voltage $V_{G2}$ and the drain voltage $V_D$ cause a second drain current $I_{D2}$ to flow between the source region 108 and the drain region 110 and to a read circuit (e.g., a sense amplifier) (not shown), which is configured to read the second data state from the FeFET device 100. The second drain current $I_{D2}$ has a second value that depends upon the second threshold voltage (and thus the second polarization 218) of the FeFET device.

Figure 2E:
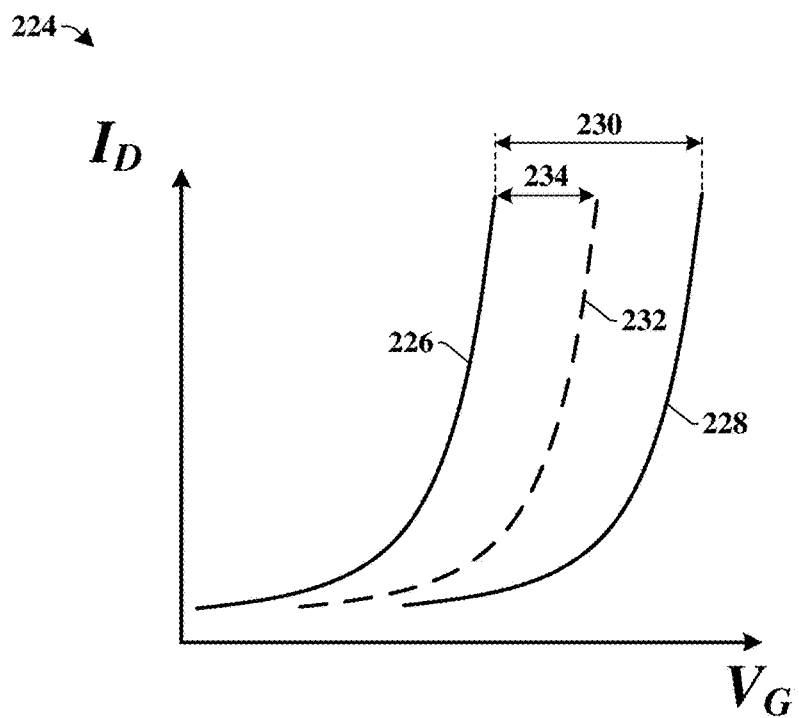
FIG. 2E illustrates a graph showing an exemplary memory window of a FeFET device having a polarization enhancement structure.

FIG. 2E illustrates a graph 224 showing an exemplary memory window of a FeFET device.

As shown in graph 224, when a FeFET device is storing a first data state (e.g., a logical "1") the FeFET device will have a threshold voltage corresponding to the drain current illustrated by line 226. When the FeFET device is storing a second data state (e.g., a logical "0") the FeFET device will have a threshold voltage corresponding to the drain current illustrated by line 228. A first memory window 230 corresponds to a difference between line 226 and line 228. For comparison, a FeFET device that does not have the polarization enhancement structure and that is storing a second data state (e.g., a logical "0") will have a threshold voltage corresponding to the drain current illustrated by line 232. A second memory window 234, which corresponds to a difference between line 226 and line 232, is smaller than the first memory window 230.

Figure 3A:
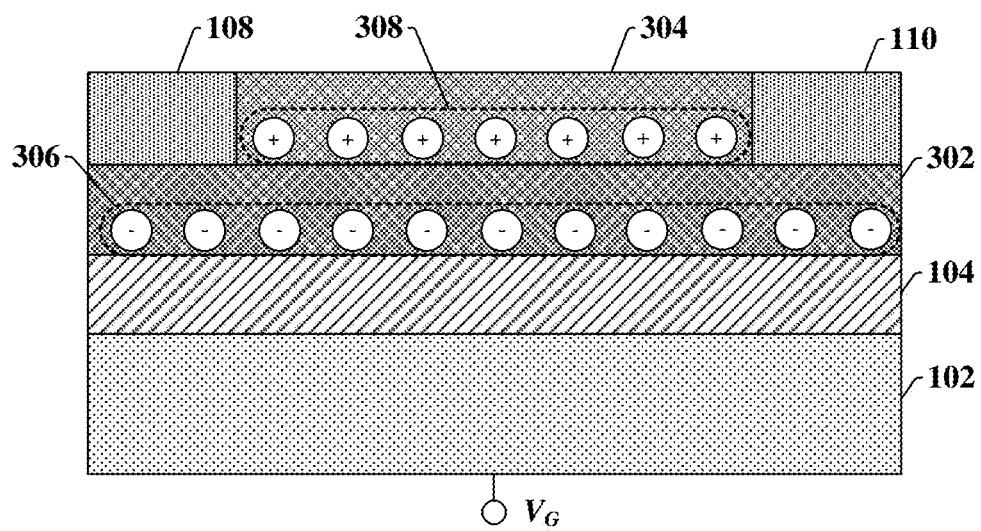
FIGS. 3A-3B illustrate cross-sectional views of some embodiments of different types of FeFET devices having a polarization enhancement structure.
Figure 3B:
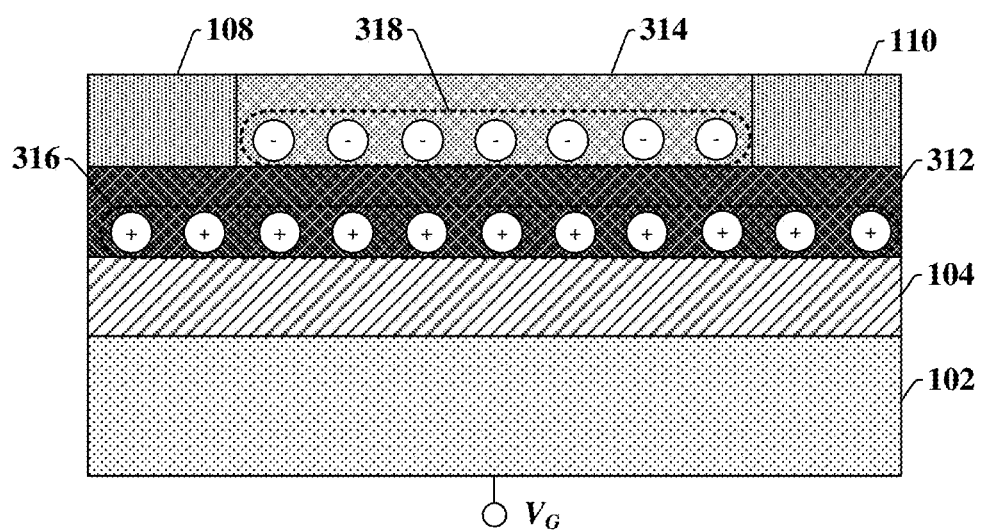

Although FIGS. 2A-2E are described in relation to a FeFET device having an n-type oxide semiconductor it will be appreciated that the disclosed FeFET device is not limited to such embodiments. FIGS. 3A-3B illustrate cross-sectional views of various embodiments of a FeFET device having different oxide semiconductor types.

FIG. 3A illustrates a cross-sectional view of an n-type FeFET device 300 having an n-type oxide semiconductor.

The n-type FeFET device 300 comprises a ferroelectric structure 104 disposed between a gate structure 102 and an n-type oxide semiconductor 302. A source region 108 and a drain region 110 are disposed on the n-type oxide semiconductor 302 and are separated by a p-type semiconductor 304 (e.g., a p-type semiconductor material and/or a p-type oxide semiconductor material). During operation, the gate structure 102 is configured to generate an electric field based upon a gate voltage $V_G$ that is applied to the gate structure 102. If a positive gate voltage $V_G$ is applied to the gate structure 102, negative charge carriers 306 accumulate within the n-type oxide semiconductor 302. If a negative gate voltage $V_G$ is applied to the gate structure 102, a significant number of positive charge carriers do not accumulate within the n-type oxide semiconductor 302, however positive charge carriers 308 accumulate within the p-type semiconductor 304.

FIG. 3B illustrates a cross-sectional view of a p-type FeFET device 310 having a p-type oxide semiconductor.

The p-type FeFET device 310 comprises a ferroelectric structure 104 disposed between a gate structure 102 and a p-type oxide semiconductor 312. A source region 108 and a drain region 110 are disposed on the p-type oxide semiconductor 312 and are separated by an n-type semiconductor 314 (e.g., an n-type semiconductor material and/or an n-type oxide semiconductor material). During operation, the gate structure 102 is configured to generate an electric field based upon a gate voltage $V_G$ that is applied to the gate structure 102. If a negative gate voltage $V_G$ is applied to the gate structure 102, positive charge carriers 316 accumulate within the p-type oxide semiconductor 312. If a positive gate voltage $V_G$ is applied to the gate structure 102, a significant number of negative charge carriers do not accumulate within the p-type oxide semiconductor 312, however negative charge carriers 318 accumulate within the n-type semiconductor 314.

Figure 4A:
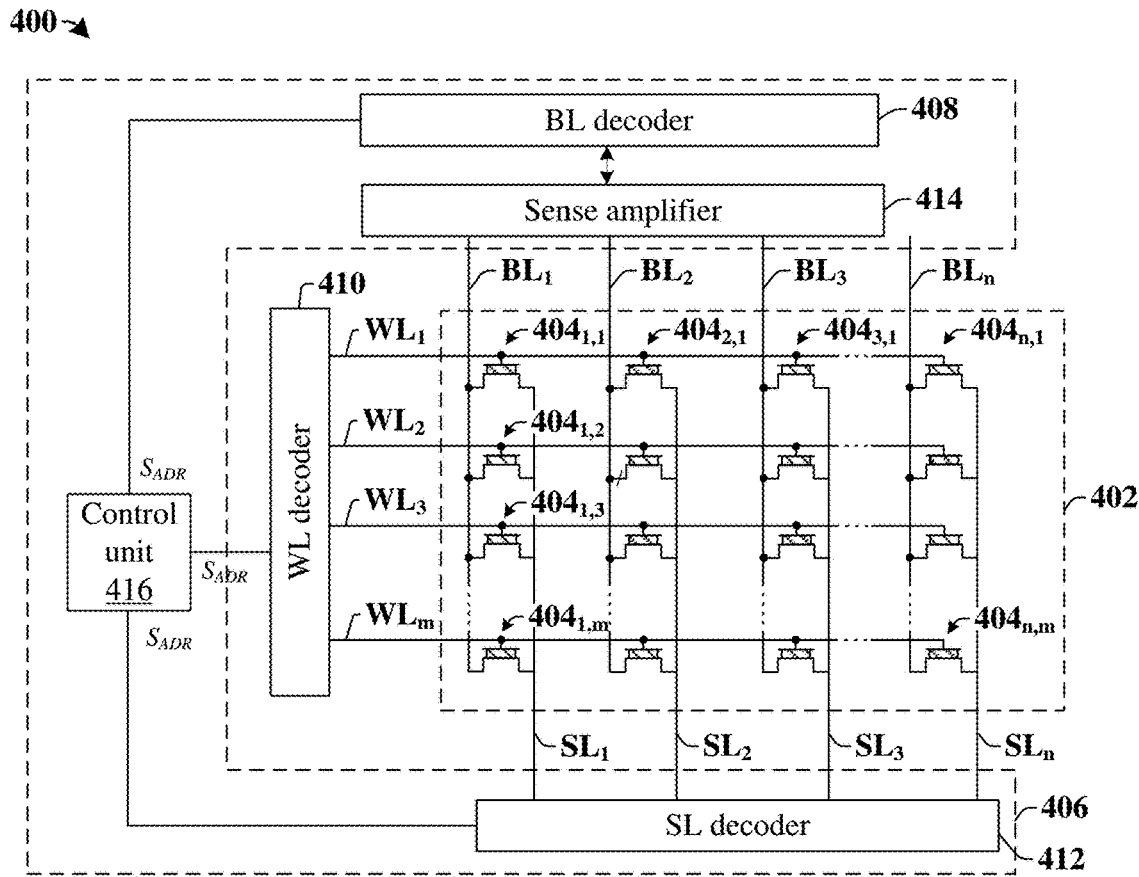
FIG. 4A illustrates an exemplary schematic diagram of FeFET memory circuit having a memory array comprising FeFET devices respectively having a polarization enhancement structure.

FIG. 4A illustrates an exemplary schematic diagram of FeFET memory circuit 400 having FeFET devices respectively comprising a polarization enhancement structure.

The FeFET memory circuit 400 comprises a FeFET memory array 402 including a plurality of FeFET devices $404_{1,1}$-$404_{n,m}$. The plurality of FeFET devices $404_{1,1}$-$404_{n,m}$ are arranged within the FeFET memory array 402 in rows and/or columns. The plurality of FeFET devices $404_{1,x}$-$404_{n,x}$ within a row are operably coupled to word-lines $WL_x$ (x=1–m). The plurality of FeFET devices $404_{x,1}$-$404_{x,m}$ within a column are operably coupled to bit-lines $BL_x$ (x=1–n) and source-lines $SL_x$ (x=1–n).

Figure 4B:
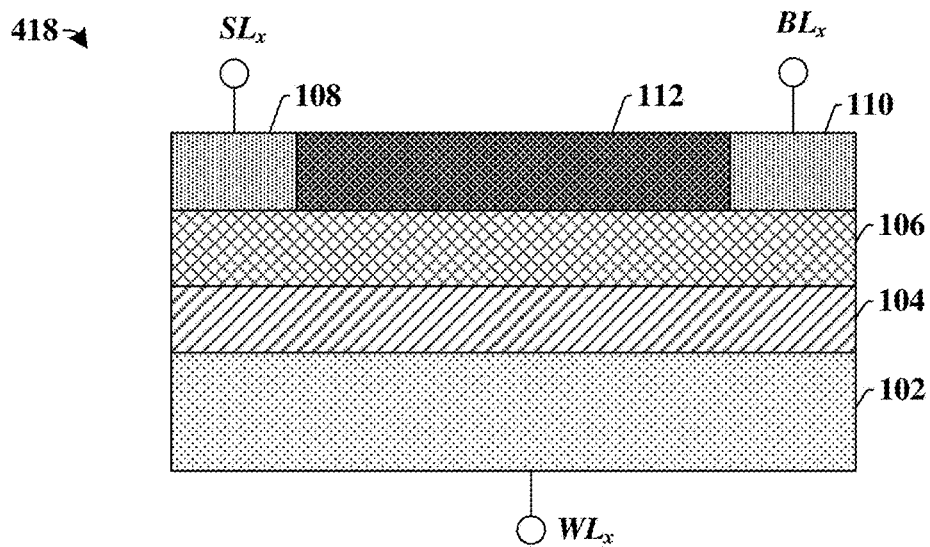
FIG. 4B illustrates a cross-sectional view of an exemplary embodiment of a cross-sectional view of a FeFET device within the memory array of FIG. 4A.

FIG. 4B illustrates a cross-sectional view of an exemplary embodiment of a cross-sectional view of a FeFET device 418 of the plurality of FeFET devices (e.g., $404_{1,1}$-$404_{n,m}$ of FIG. 4A) within a memory array. The FeFET device 418 comprises ferroelectric structure 104 disposed between a gate structure 102 and an oxide semiconductor 106. A polarization enhancement structure 112 is disposed on the oxide semiconductor 106 between a source region 108 and a drain region 110. The gate structure 102 coupled to a word-line $WL_x$, the source region 108 is coupled to a source-line $SL_x$, and the drain region 110 is coupled to a bit-line $BL_x$.

Referring again to FIG. 4A, the word-lines $WL_1$-$WL_m$, the bit-lines $BL_1$-$BL_n$, and the source-lines $SL_1$-$SL_n$ are coupled to control circuitry 406. In some embodiments, the control circuitry 406 comprises a word-line decoder 410 coupled to the word-lines $WL_1$-$WL_m$, a bit-line decoder 408 coupled to the bit-lines $BL_1$-$BL_n$, and a source-line decoder 412 coupled to the source-lines $SL_1$-$SL_n$. In some embodiments, the control circuitry 406 further comprises a sense amplifier 414 coupled to the bit-lines $BL_1$-$BL_n$ or the source-lines $SL_1$-$SL_n$. In some embodiments, the control circuitry 406 further comprises a control unit 416 configured to send address information $S_{ADR}$ to the word-line decoder 410, the bit-line decoder 408, and/or the source-line decoder 412 to enable the control circuitry 406 to selectively access one or more of the plurality of FeFET devices $404_{1,1}$-$404_{n,m}$.

For example, during operation, the control unit 416 is configured to provide address information $S_{ADR}$ to the word-line decoder 410, the bit-line decoder 408, and the source-line decoder 412. Based on the address information $S_{ADR}$, the word-line decoder 410 is configured to selectively apply a bias voltage to one of the word-lines $WL_1$-$WL_m$. Concurrently, the bit-line decoder 408 is configured to selectively apply a bias voltage to one of the bit-lines $BL_1$-$BL_n$ and/or the source-line decoder 412 is configured to selectively apply a bias voltage to one of the source-lines $SL_1$-$SL_n$. By applying bias voltages to selective ones of the word-lines $WL_1$-$WL_m$, the bit-lines $BL_1$-$BL_n$, and/or the source-lines $SL_1$-$SL_n$, the FeFET memory circuit 400 can be operated to write different data states to and/or read data states from the plurality of FeFET devices $404_{1,1}$-$404_{n,m}$.

Figure 5A:
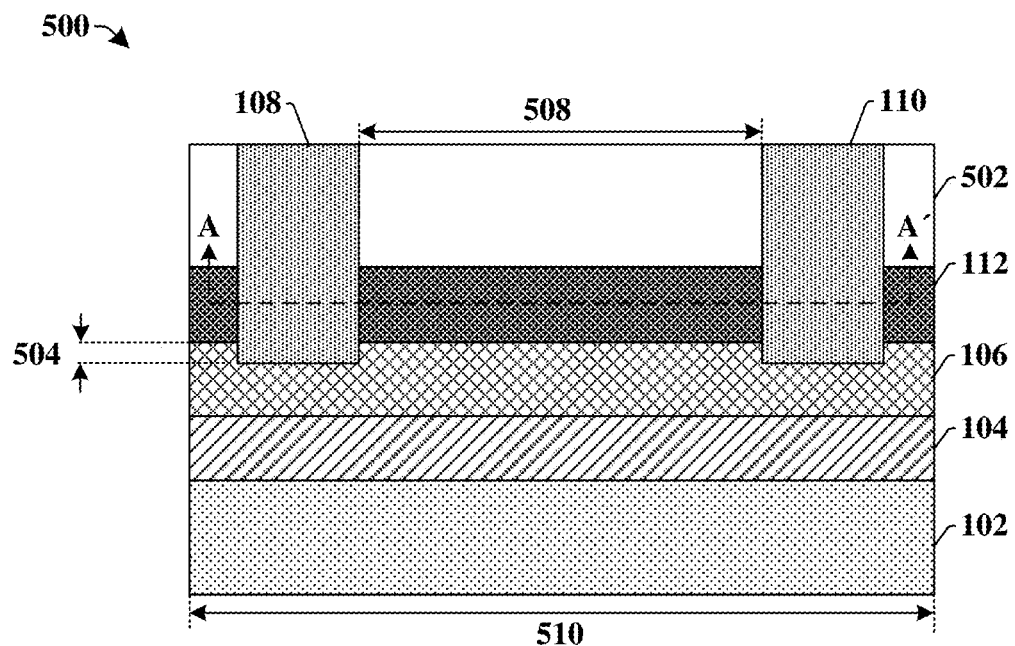
FIGS. 5A-5B illustrate some alternative embodiments of FeFET devices having a polarization enhancement structure.

FIG. 5A illustrates a cross-sectional view of some alternative embodiments of a FeFET device 500 having a polarization enhancement structure. Although FIG. 5A illustrates a FeFET device having an oxide semiconductor stacked vertically onto a ferroelectric structure and a polarization enhancement structure stacked vertically onto an upper surface of an oxide semiconductor, it will be appreciated that in other alternative embodiments (e.g., in a 3D-FeFET device) the oxide semiconductor may be arranged along a sidewall of and/or below a ferroelectric structure and/or the polarization enhancement structure may be arranged along a sidewall of and/or below the oxide semiconductor.

The FeFET device 500 comprises a ferroelectric structure 104 disposed between a gate structure 102 and an oxide semiconductor 106. A source region 108 and a drain region 110 are disposed on the oxide semiconductor 106 and are separated by a polarization enhancement structure 112. The ferroelectric structure 104 comprises a material having dielectric crystals which exhibit an electric polarization having a direction that can be controlled by an electric field. For example, in some embodiments, the ferroelectric structure 104 may comprise hafnium-oxide ($HfO_2$), hafnium zinc oxide ($HfZnO_2$), or the like. In some embodiments, the oxide semiconductor 106 may comprise a first semiconductor type. For example, in some embodiments the oxide semiconductor 106 may comprise an n-type oxide semiconductor, such as indium gallium zinc oxide (IGZO), indium gallium zinc tin oxide (IGZTO), indium tungsten oxide (IWO), indium tungsten zinc oxide (IWZO), indium zinc oxide (IZO), zinc oxide (ZnO), or the like. In other embodiments, the oxide semiconductor 106 may comprise a p-type oxide semiconductor, such as tin oxide (SnO), nickel oxide (NiO), copper oxide ($Cu_2O$), or the like.

Figure 5B:
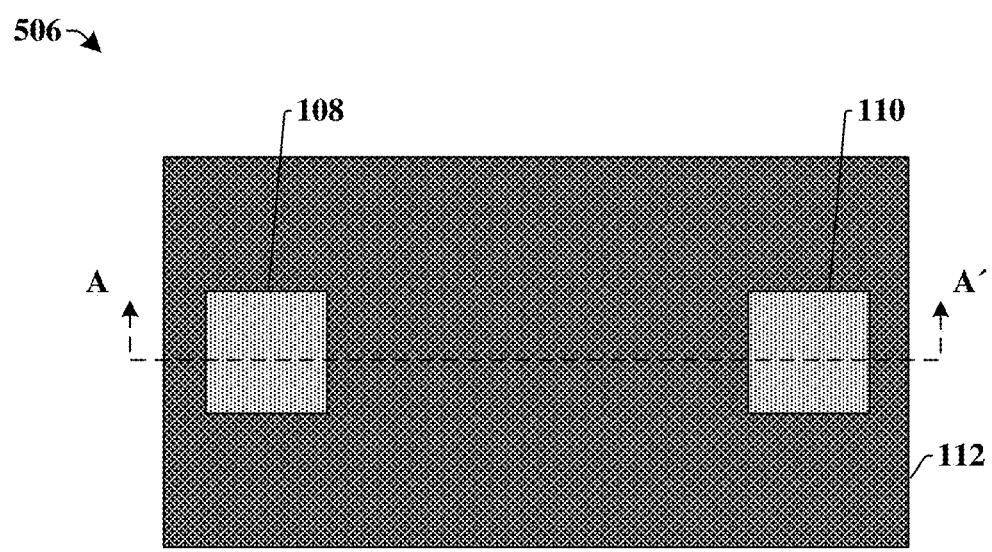

In some embodiments, the polarization enhancement structure 112 may be arranged along opposing sides of the source region 108 and along opposing sides of the drain region 110. In some such embodiments, shown in the exemplary top-view 506 of FIG. 5B (taken along cross-sectional line A-A' of FIG. 5A), the polarization enhancement structure 112 may continuously extend in a closed loop around the source region 108 and the drain region 110. In some embodiments, the polarization enhancement structure 112 continuously extends for a first width 508 along the cross-sectional view of FIG. 5A, which extends through the source region 108 and the drain region 110, while the oxide semiconductor 106 continuously extends over a larger second width 510 as viewed along the cross-sectional view.

In some embodiments, the oxide semiconductor 106 and the polarization enhancement structure 112 may be configured to have a low (e.g., substantially zero) source-to-drain current when the FeFET device 500 is in an "off" state (e.g., when a 0 V gate voltage is applied to the gate structure 102). In some such embodiments, the polarization enhancement structure 112 and/or the oxide semiconductor 106 may have doping concentrations that are less than or equal to approximately $1\times10^{19}$ at/cm$^{-3}$, less than or equal to approximately $1\times10^{18}$ at/cm$^{-3}$, less than or equal to approximately $1\times10^{19}$ at/cm$^{-3}$, or other similar values. In some additional embodiments, the oxide semiconductor 106 and the polarization enhancement structure 112 may respectively have a thicknesses that is in a range of between approximately 1 nanometers (nm) and approximately 10 nm, between approximately 5 nm and approximately 20 nm, between approximately 5 nm and approximately 15 nm, or other similar values. The thickness and/or doping concentration of the polarization enhancement structure 112 and/or the oxide semiconductor 106 provide for good on-off modulation of the FeFET device 500 and mitigate a current from flowing through the oxide semiconductor 106 and the polarization enhancement structure 112 when a 0 V gate voltage is applied to the gate structure 102.

In some embodiments, the polarization enhancement structure 112 may comprise and/or be one or more semiconductor materials and/or semiconductor oxide materials having a second semiconductor type that is different than the first semiconductor type of the oxide semiconductor 106. In some embodiments, the polarization enhancement structure 112 may comprise a p-type semiconductor such as p-doped silicon, p-doped germanium, tin oxide (SnO), nickel oxide (NiO), copper oxide ($Cu_2O$), tungsten diselenide ($WSe_2$), Tungsten ditelluride ($WTe_2$), molybdenum ditelluride ($MoTe_2$), or the like. In other embodiments, the polarization enhancement structure 112 may comprise an n-type semiconductor such as n-doped silicon, n-doped germanium, indium gallium zinc oxide (IGZO), indium gallium zinc tin oxide (IGZTO), indium tungsten oxide (IWO), indium tungsten zinc oxide (IWZO), indium zinc oxide (IZO), zinc oxide (ZnO), or the like. In some embodiments, the polarization enhancement structure 112 may have a doping concentration that is substantially homogeneous. In other embodiments, the polarization enhancement structure 112 may have a gradient doping concentration that decreases from a lower surface of the polarization enhancement structure 112 facing the oxide semiconductor 106 to an upper surface of the polarization enhancement structure 112 facing away from the oxide semiconductor 106.

In some embodiments, the gate structure 102 may comprise a conductive material. In some embodiments, the conductive material of the gate structure 102 may have a metal work function that is configured increase a threshold voltage of the FeFET device 500, thereby further mitigating a current flowing through the oxide semiconductor 106 and the polarization enhancement structure 112 when the FeFET device 500 is in an "off" state (e.g., when a 0 V gate voltage is applied to the gate structure 102). In some embodiments, the conductive material of the gate structure 102 may have a metal work function that is between approximately 4.0 electron-volts (eV) and approximately 5.0 eV, that is approximately 4.5 eV, or other similar values. In some such embodiments, a Fermi level of the gate structure 102 may between Fermi levels of the oxide semiconductor 106 and the polarization enhancement structure 112. In some embodiments, the gate structure 102 may comprise titanium, titanium nitride, tungsten, tungsten nitride, copper, gold, zinc, aluminum, or the like.

In some embodiments, a dielectric layer 502 is arranged over the polarization enhancement structure 112. In some such embodiments, the source region 108 and the drain region 110 extend through the dielectric layer 502 and the polarization enhancement structure 112 to contact the oxide semiconductor 106. In some embodiments, the dielectric layer 502 may comprise an oxide (e.g., silicon oxide, silicon dioxide, etc.), a nitride (e.g., silicon nitride), a carbide (e.g., silicon carbide), or the like. In some embodiments, the source region 108 and the drain region 110 may have uppermost surfaces that are substantially co-planar (e.g., co-planar within a tolerance of a CMP process) with an upper surface of the dielectric layer 502. In some embodiments, the source region 108 and/or the drain region 110 may extend a non-zero distance 504 to within the oxide semiconductor 106, so that the oxide semiconductor 106 extends along lower surfaces and sidewalls of the source region 108 and/or the drain region 110. In some embodiments, the non-zero distance 504 may be in a range of between approximately 1 Angstrom (Å) and approximately 10 Å, between approximately 5 Å and approximately 20 Å, or other similar values. In some embodiments, the source region 108 and the drain region 110 may comprise and/or be a metal, such as titanium, titanium nitride, tungsten, tungsten nitride, copper, gold, zinc, aluminum, or the like.

In various embodiments, the disclosed FeFET device may have different structures. FIGS. 6A-6D illustrate some embodiments of FeFET devices having different structures. It will be appreciated that the embodiments of FIGS. 6A-6D are only examples of possible structures of a disclosed FeFET device having a polarization enhancement structure and that other FeFET device structures also fall within the scope of this disclosure.

Figure 6A:
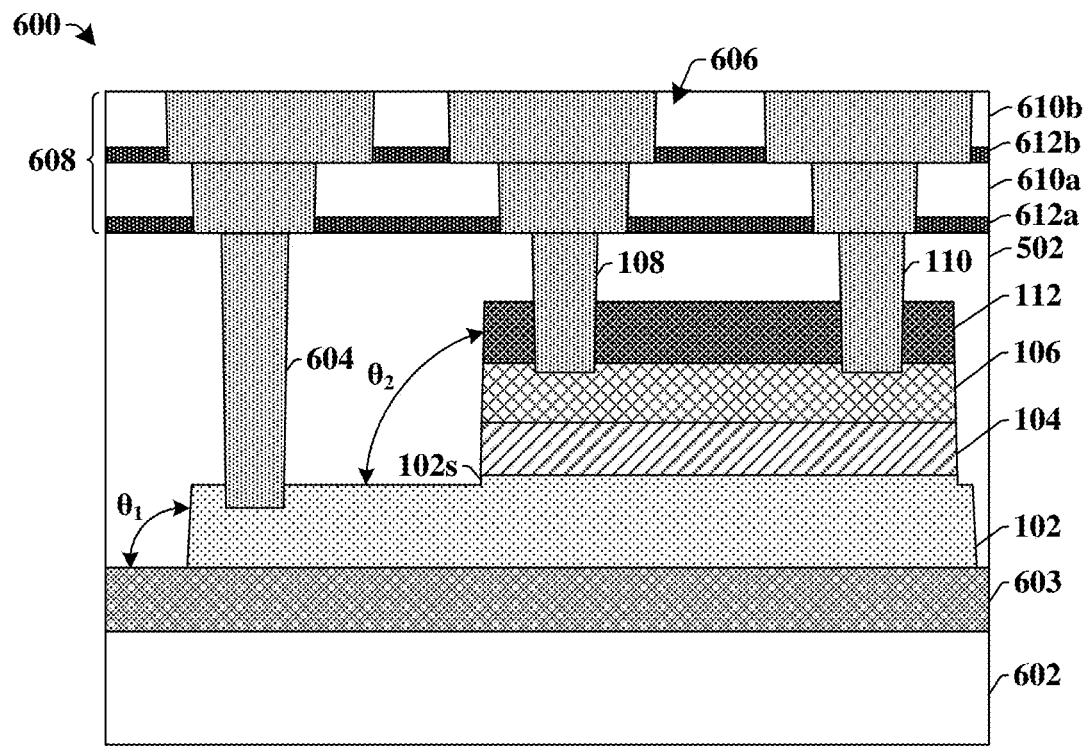
FIGS. 6A-6D illustrate some embodiments of integrated chips comprising a FeFET device having a polarization enhancement structure.

FIG. 6A illustrates a cross-sectional view of some embodiments of an integrated chip 600 comprising a FeFET device having a polarization enhancement structure.

The integrated chip 600 comprises a FeFET device having a gate structure 102 disposed over an upper surface of a substrate 602. In some embodiments, a dielectric isolation structure 603 is disposed over the substrate 602 and separates the gate structure 102 from the substrate 602. A ferroelectric structure 104 is arranged on the gate structure 102, an oxide semiconductor 106 is arranged on the ferroelectric structure 104, and a polarization enhancement structure 112 is arranged on the oxide semiconductor 106. In some embodiments, the gate structure 102 laterally extends from directly below the ferroelectric structure 104 to past one or more outermost sidewalls of the ferroelectric structure 104. In some embodiments, the outermost sidewalls of the ferroelectric structure 104 are substantially aligned with outermost sidewalls of the oxide semiconductor 106 and the polarization enhancement structure 112. In some embodiments, the gate structure 102 may further comprise an interior sidewall 102s that is directly over the gate structure 102 and substantially aligned with an outermost sidewall of the ferroelectric structure 104. In such embodiments, the gate structure 102 may have a first thickness directly below the ferroelectric structure 104 and a smaller second thickness outside of the ferroelectric structure 104.

A dielectric layer 502 is arranged over the gate structure 102, the ferroelectric structure 104, the oxide semiconductor 106, and the polarization enhancement structure 112. A source region 108 and a drain region 110 extend through the dielectric layer 502 and the polarization enhancement structure 112 to contact the oxide semiconductor 106. In some embodiments, a gate contact 604 also extends through the dielectric layer 502 to contact the gate structure 102.

In some embodiments, the gate structure 102 may have outermost sidewalls that are angled at a first angle $\theta_1$ as measured outside of the gate structure 102 and with respect to the upper surface of the substrate 602. In various embodiments, the first angle $\theta_1$ may be in a range of between approximately 92° and approximately 105°. In some embodiments, the ferroelectric structure 104, the oxide semiconductor 106, and/or the polarization enhancement structure 112 may have outermost sidewalls that are angled at a second angle $\theta_2$ as measured with respect to the upper surface of the substrate 602. In various embodiments, the second angle $\theta_2$ may be in a range of between approximately 92° and approximately 105°. In some embodiments, the first angle θ₁ may be different than the second angle θ₂.

A plurality of additional interconnects 606 are disposed within an inter-level dielectric (ILD) structure 608 disposed over the dielectric layer 502. In some embodiments, the ILD structure 608 comprises a plurality of stacked ILD layers 610a-610b separated by one or more etch stop layers 612a-612b. In some embodiments, the plurality of stacked ILD layers 610a-610b may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. In various embodiments, the one or more etch stop layers 612a-612b may comprise a carbide (e.g., silicon carbide, silicon oxycarbide, or the like), a nitride (e.g., silicon nitride, silicon oxynitride, or the like), or the like.

Figure 6B:
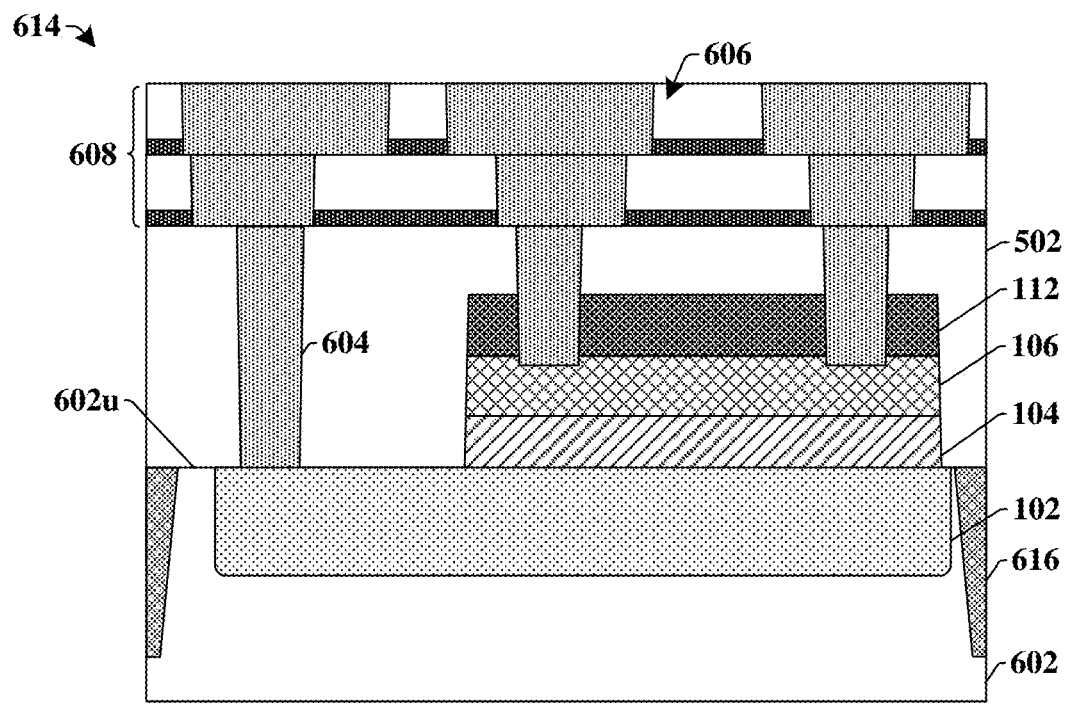

FIG. 6B illustrates a cross-sectional view of some alternative embodiments of an integrated chip 614 comprising a FeFET device having a polarization enhancement structure.

The integrated chip 614 includes a FeFET device having a gate structure 102 comprising a doped region arranged along an upper surface 602u of a substrate 602. A ferroelectric structure 104 is arranged on the upper surface 602u of the substrate 602 and directly over the gate structure 102. An oxide semiconductor 106 is arranged on the ferroelectric structure 104 and a polarization enhancement structure 112 is arranged on the oxide semiconductor 106. In some embodiments, the gate structure 102 laterally extends from directly below the ferroelectric structure 104 to past one or more outermost sidewalls of the ferroelectric structure 104. In some embodiments, one or more isolation structures 616 are disposed within the substrate 102 along opposing sides of the gate structure 102. The one or more isolation structures 616 are configured to provide electrical isolation between the gate structure 102 and an adjacent gate structure (not shown). In some embodiments, the one or more isolation structure 616 may comprise shallow trench isolation (STI) structures.

A dielectric layer 502 is arranged over the gate structure 102, the ferroelectric structure 104, the oxide semiconductor 106, and the polarization enhancement structure 112. A source region 108 and a drain region 110 extend through the dielectric layer 502 and the polarization enhancement structure 112 to contact the oxide semiconductor 106. In some embodiments, a gate contact 604 also extends through the dielectric layer 502 to contact the gate structure 102.

Figure 6C:
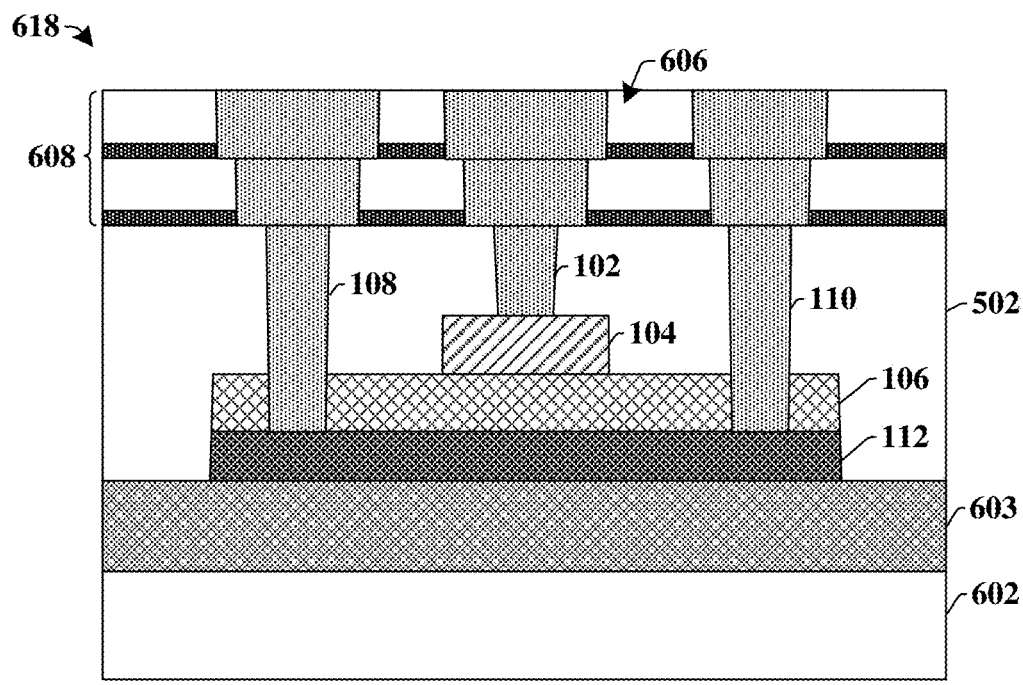

FIG. 6C illustrates a cross-sectional view of some alternative embodiments of an integrated chip 618 comprising a FeFET device having a polarization enhancement structure.

The integrated chip 600 includes a dielectric isolation structure 603 disposed over a substrate 602. A FeFET device is arranged over the dielectric isolation structure 603. The FeFET device comprises a polarization enhancement structure 112 arranged on the dielectric isolation structure 603 and an oxide semiconductor 106 arranged on the polarization enhancement structure 112. A ferroelectric structure 104 is arranged on an upper surface of the oxide semiconductor 106 that faces away from the substrate 102. In some embodiments, the oxide semiconductor 106 and/or the polarization enhancement structure 112 laterally extend past opposing outermost sidewalls of the ferroelectric structure 104.

A dielectric layer 502 is arranged over the FeFET device. A source region 108 and a drain region 110 extend through the dielectric layer 502 to contact the oxide semiconductor 106. In some embodiments, the source region 108 and the drain region 110 may extend completely through the oxide semiconductor 106 to contact the polarization enhancement structure 112. A gate structure 102 also extends through the dielectric layer 502 to contact the ferroelectric structure 104. The source region 108, the drain region 110 and the gate structure 102 are coupled to a plurality of additional interconnects 606 are disposed within an ILD structure 608 disposed over the dielectric layer 502.

Figure 6D:
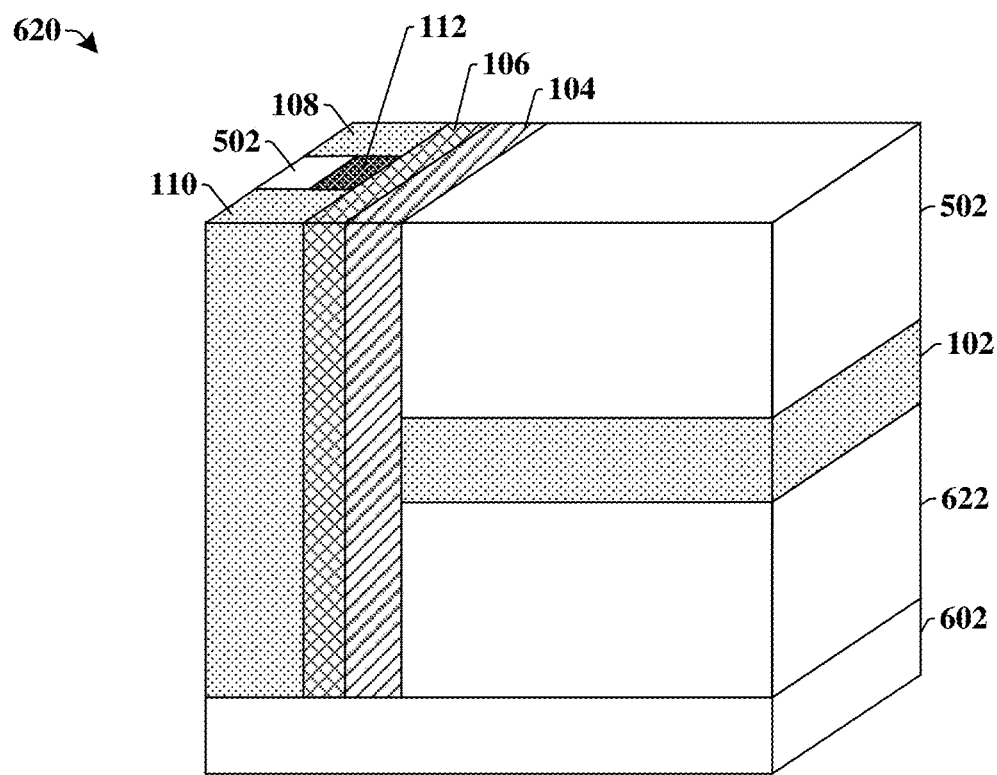

FIG. 6D illustrates a three-dimensional view of some alternative embodiments of an integrated chip 620 comprising a FeFET device having a polarization enhancement structure.

The integrated chip 620 includes a lower dielectric layer 622 disposed over a substrate 602. A gate structure 102 is disposed on the lower dielectric layer 622 and a dielectric layer 502 is arranged over the gate structure 102. A ferroelectric structure 104 is arranged on sidewalls of the lower dielectric layer 622, the gate structure 102, and the dielectric layer 502. An oxide semiconductor 106 is arranged along sidewalls of the ferroelectric structure 104 that faces away from the gate structure 102. A source region 108 and a drain region 110 are disposed on a side of the oxide semiconductor 106. A polarization enhancement structure 112 is arranged between the source region 108 and the drain region 110 and along the side of the oxide semiconductor 106.

Figure 7:
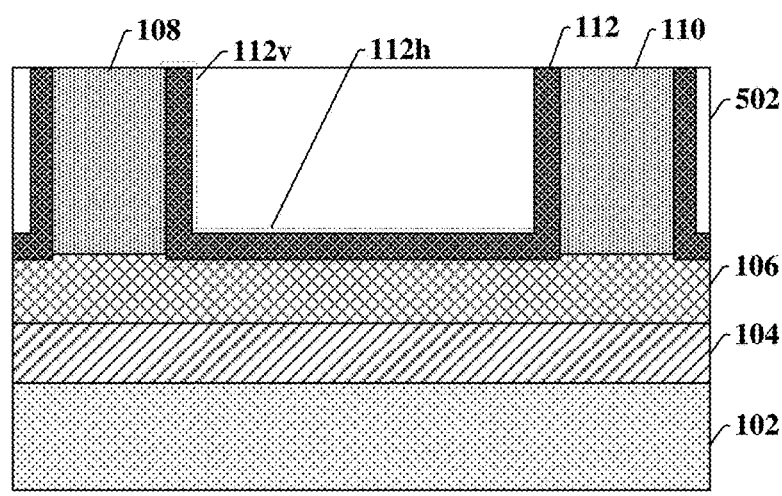
FIG. 7 illustrates a cross-sectional view of some alternative embodiments of a FeFET device having a polarization enhancement structure.

FIG. 7 illustrates a cross-sectional view of some alternative embodiments of a FeFET device 700 having a polarization enhancement structure.

The FeFET device 700 comprises a ferroelectric structure 104 disposed between a gate structure 102 and an oxide semiconductor 106. A source region 108 and a drain region 110 are disposed on the oxide semiconductor 106 and are separated by a polarization enhancement structure 112. In some embodiments, the polarization enhancement structure 112 may be arranged along opposing sides of the source region 108 and along opposing sides of the drain region 110. In some embodiments, the polarization enhancement structure 112 comprises a horizontally extending segment 112h extending along an upper surface of the oxide semiconductor 106 and one or more vertically extending segments 112v protruding outward from an upper surface of the horizontally extending segment 112h. In some embodiments, the one or more vertically extending segments 112v extend along sidewalls of the source region 108 and/or the drain region 110.

A dielectric layer 502 is arranged over the polarization enhancement structure 112. The dielectric layer 502 extends along upper surfaces and sidewalls of the polarization enhancement structure 112. In some embodiments, the dielectric layer 502 may be separated from the source region 108 and the drain region 110 by the polarization enhancement structure 112. In some embodiments, the dielectric layer 502 may extend to an uppermost surface of the polarization enhancement structure 112. In some embodiments, the dielectric layer 502, the polarization enhancement structure 112, the source region 108 and the drain region 110 have uppermost surfaces that are substantially co-planar (e.g., co-planar within a tolerance of a CMP process).

Figure 8:
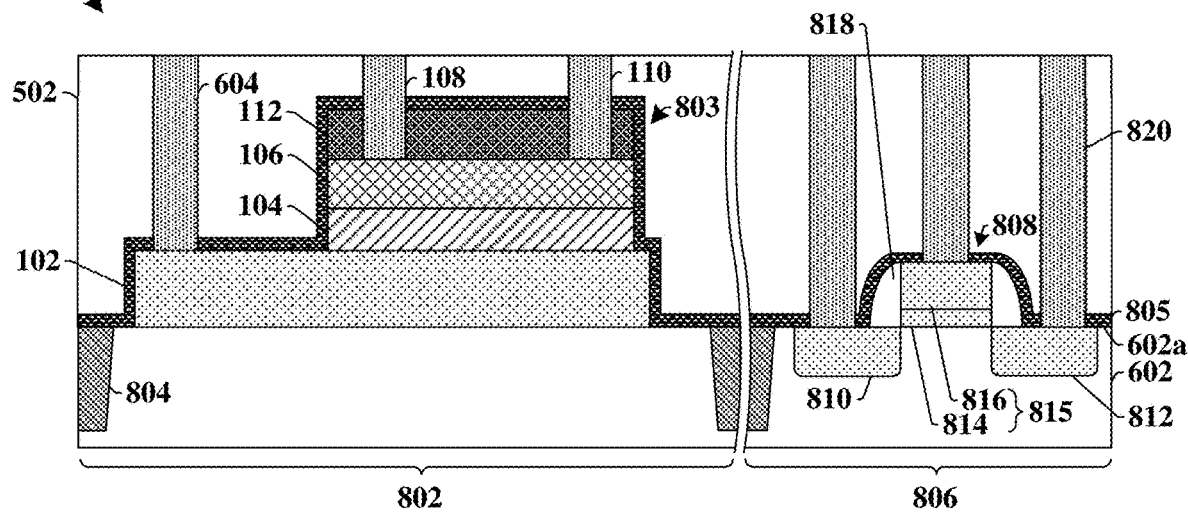
FIG. 8 illustrates a cross-sectional view of some alternative embodiments of an integrated chip comprising a FeFET device having a polarization enhancement structure.

FIG. 8 illustrates some alternative embodiments of an integrated chip 800 comprising a FeFET device having a polarization enhancement structure.

The integrated chip 800 includes an embedded memory region 802 and a logic region 806. The embedded memory region 802 comprises a FeFET device 803 disposed on a first side 602a of a substrate 602. The FeFET device 803 comprises a ferroelectric structure 104 arranged on a gate structure 102, an oxide semiconductor 106 arranged on the ferroelectric structure 104, and a polarization enhancement structure 112 arranged on the oxide semiconductor 106. A source region 108 and a drain region 110 extend through the polarization enhancement structure 112 to contact the oxide semiconductor 106. In some embodiments, a contact etch stop layer (CESL) 805 may be arranged over the FeFET device 803.

In some embodiments, one or more isolation structures 804 may be arranged within the substrate 602 on opposing sides of the FeFET device 803. The isolation structures 804 may comprise one or more dielectric materials arranged within trenches defined by interior surfaces of the substrate 602. In some embodiments, the isolation structures 804 may comprise shallow trench isolation (STI) structures. In some such embodiments, the isolation structures 804 may comprise a same isolation structure continuously extending in a closed loop around a perimeter of the FeFET device 803.

The logic region 806 comprises a transistor device 808 arranged on the first side 602a of the substrate 602. The transistor device 808 comprises a source region 810, a drain region 812 separated from the source region 810 by a channel region, and a gate structure 815 over the channel region. In some embodiments, the transistor device 808 may comprise a high-k metal gate (HKMG) transistor. In such embodiments, the gate structure 815 may comprise a metal gate electrode 816 (e.g., comprising aluminum, ruthenium, palladium, or the like) and a gate dielectric 814 comprising a high-k dielectric (e.g., comprising aluminum oxide, hafnium oxide, or the like). In other embodiments, the gate structure 815 may comprise a polysilicon gate electrode and a gate dielectric comprising an oxide (e.g., silicon dioxide). In some embodiments, insulating sidewall spacers 818 may be arranged along opposing sides of the gate structure 815. The source region 810, the drain region 812, and the gate structure 815 are coupled to a plurality of interconnects 820 surrounded by the dielectric layer 502.

FIGS. 9-19 illustrate cross-sectional views 900-1900 of some embodiments of a method of forming an integrated chip comprising a FeFET device having a polarization enhancement structure. Although FIGS. 9-19 are described in relation to a method, it will be appreciated that the structures disclosed in FIGS. 9-19 are not limited to such a method, but instead may stand alone as structures independent of the method.

Figure 9:
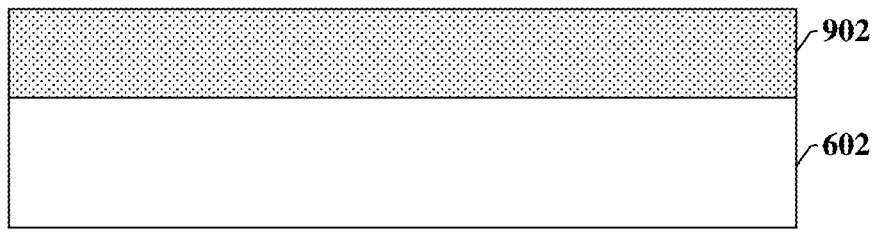
FIGS. 9-19 illustrate cross-sectional views of some embodiments of a method of forming an integrated chip comprising a FeFET device having a polarization enhancement structure.

As shown in cross-sectional view 900 of FIG. 9, a gate layer 902 is formed. In some embodiments, the gate layer 902 may be formed over a substrate 602. In various embodiments, the substrate 602 may be any type of semiconductor body (e.g., silicon, SiGe, SOI, etc.), such as a semiconductor wafer and/or one or more die on a wafer, as well as any other type of semiconductor and/or epitaxial layers, associated therewith. The gate layer 902 may comprise one or more conductive materials. In some embodiments, the one or more conductive materials may comprise and/or be a metal such as titanium, titanium nitride, tungsten, tungsten nitride, copper, gold, zinc, aluminum, or the like. In some embodiments, the one or more conductive materials may have a metal work function that is between approximately 4.0 electron-volts (eV) and approximately 5.0 eV, that is approximately 4.5 eV, or other similar values. In various embodiments, the gate layer 902 may be formed by way of one or more deposition processes (e.g., ALD processes, CVD processes, PE-CVD processes, or the like).

Figure 10:
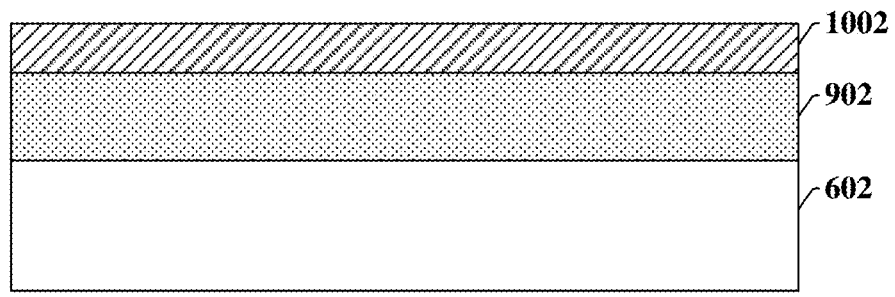

As shown in cross-sectional view 1000 of FIG. 10, a ferroelectric layer 1002 may be formed over the gate layer 902. The ferroelectric layer 1002 may comprise one or more ferroelectric materials. In some embodiments, the one or more ferroelectric materials may comprise hafnium oxide, hafnium zinc oxide, or the like. In various embodiments, the ferroelectric layer 1002 may be formed by way of one or more deposition processes (e.g., ALD processes, CVD processes, PE-CVD processes, or the like).

Figure 11:
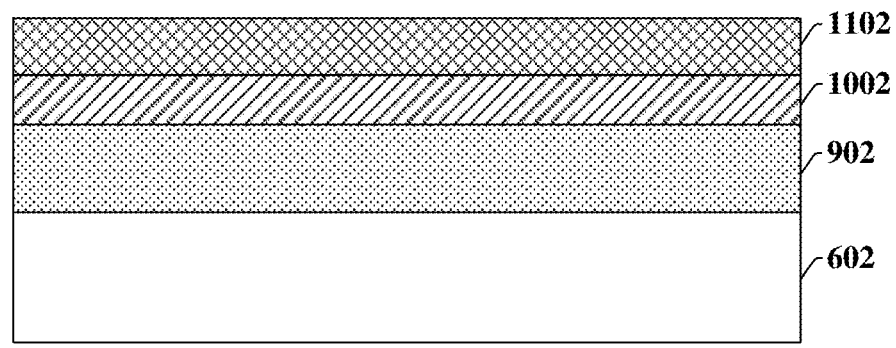

As shown in cross-sectional view 1100 of FIG. 11, an oxide semiconductor layer 1102 is formed over the ferroelectric layer 1002. The oxide semiconductor layer 1102 may comprise one or more oxide semiconductor materials having a first type of semiconductor (e.g., an n-type semiconductor having electrons as a majority carrier or a p-type semiconductor having holes as a majority carrier). In some embodiments, the one or more oxide semiconductor materials may comprise one or more n-type oxide semiconductors, such as indium gallium zinc oxide (IGZO), indium gallium zinc tin oxide (IGZTO), indium tungsten oxide (IWO), indium tungsten zinc oxide (IWZO), indium zinc oxide (IZO), zinc oxide (ZnO), or the like. In other embodiments, the one or more oxide semiconductor materials may comprise one or more p-type oxide semiconductors, such as tin oxide (SnO), nickel oxide (NiO), copper oxide ($Cu_2O$), $NaNbO_2$, or the like. In various embodiments, the oxide semiconductor layer 1102 may be formed by way of one or more deposition processes (e.g., ALD processes, CVD processes, PE-CVD processes, or the like).

Figure 12:
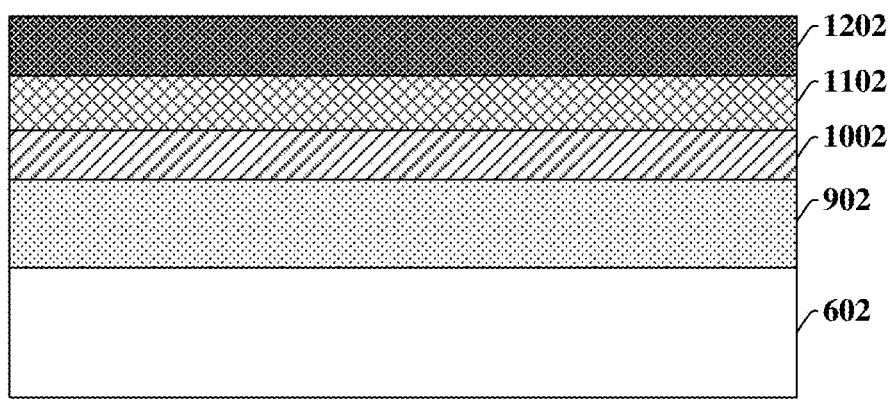

As shown in cross-sectional view 1200 of FIG. 12, one or more polarization enhancement layers 1202 may be formed over the oxide semiconductor layer 1102. The one or more polarization enhancement layers 1202 may comprise one or more semiconductors (e.g., semiconductor materials and/or oxide semiconductor materials) having a second type of semiconductor that is different than the first type of semiconductor of the oxide semiconductor layer 1102. In some embodiments, wherein the oxide semiconductor layer 1102 comprises an n-type oxide semiconductor, the one or more polarization enhancement layers 1202 may comprise one or more p-type semiconductors, such as p-doped silicon, p-doped germanium, tin oxide (SnO), nickel oxide (NiO), copper oxide ($Cu_2O$), tungsten diselenide ($WSe_2$), Tungsten ditelluride ($WTe_2$), molybdenum ditelluride ($MoTe_2$). In other embodiments, wherein the oxide semiconductor layer 1102 comprises a p-type oxide semiconductor, the one or more polarization enhancement layers 1202 may comprise one or more n-type semiconductors, such as n-doped silicon, n-doped germanium, zinc oxide (ZnO), or the like. In various embodiments, the one or more polarization enhancement layers 1202 may be formed by way of one or more deposition processes (e.g., ALD processes, CVD processes, PE-CVD processes, or the like). In some embodiments, the one or more polarization enhancement layers 1202 may be inherently doped, while in other embodiments the one or more polarization enhancement layers 1202 may be doped by way of an implantation process.

Figure 13:
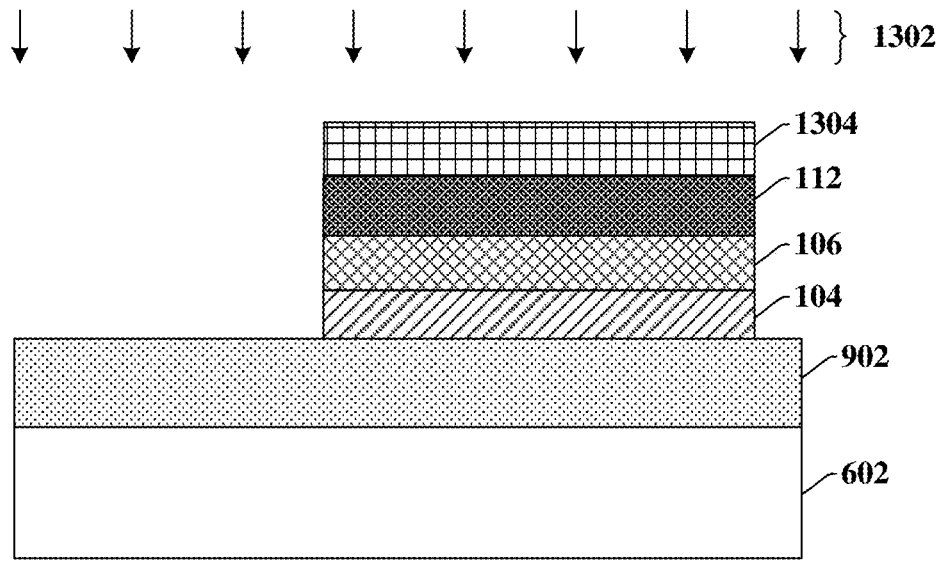

As shown in cross-sectional view 1300 of FIG. 13, a first patterning process is performed to pattern the one or more polarization enhancement layers (e.g., 1202 of FIG. 12), the oxide semiconductor layer (e.g., 1102 of FIG. 12), and the ferroelectric layer (e.g., 1002 of FIG. 12). The first patterning process removes parts of the one or more polarization enhancement layers (e.g., 1202 of FIG. 12) to form a polarization enhancement structure 112, parts of the oxide semiconductor layer (e.g., 1102 of FIG. 12) to form an oxide semiconductor 106, and parts of the ferroelectric layer (e.g., 1002 of FIG. 12) to form a ferroelectric structure 104 and to expose an upper surface of the gate structure 102. In some embodiments, the first patterning process may also remove a part of the gate structure 102.

In some embodiments, the first patterning process may selectively expose the one or more polarization enhancement layers, the oxide semiconductor layer, and the ferroelectric layer to a first etchant 1302 according to a first masking structure 1304 formed over the one or more polarization enhancement layers (e.g., 1202 of FIG. 12). In some embodiments, the first masking structure 1304 may comprise a photosensitive material (e.g., a photoresist). In other embodiments, the first masking structure 1304 may comprise a dielectric masking layer (e.g., silicon oxide, silicon dioxide, or the like), a hard mask, and/or the like. In some embodiments, the first etchant 1302 may comprise a dry etchant (e.g., having a fluorine chemistry, a chlorine chemistry, or the like). In other embodiments, the first etchant 1302 may comprise a wet etchant (e.g., comprising hydrofluoric acid, potassium hydroxide, or the like).

Figure 14:
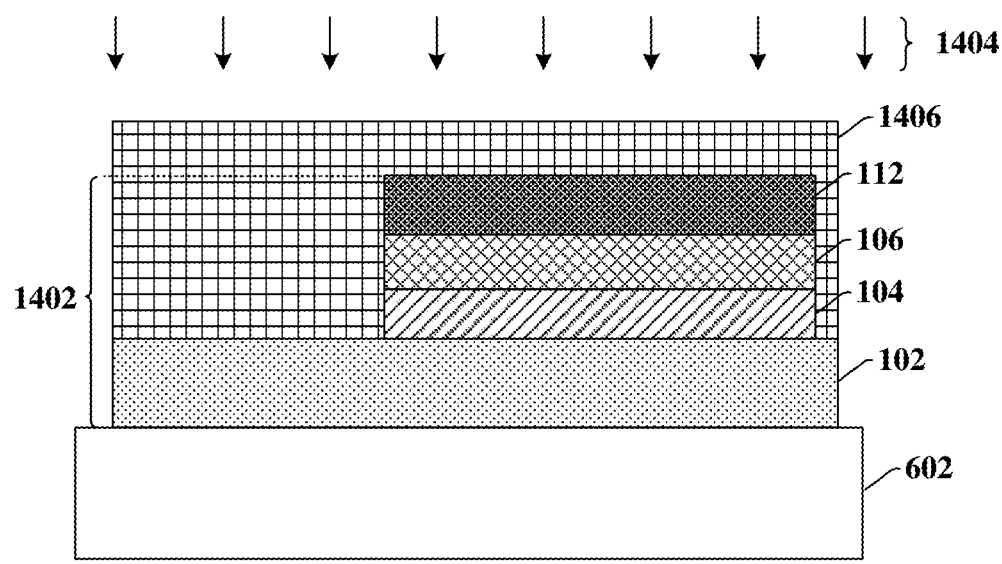

As shown in cross-sectional view 1400 of FIG. 14, a second patterning process is performed to selectively etch the gate layer (e.g., 902 of FIG. 13) and to form a gate structure 102 and a FeFET stack 1402. In some embodiments, the second patterning process may be performed by selectively exposing the gate layer to second etchant 1404 according to a second masking structure 1406 formed over the polarization enhancement structure 112 and the gate layer. In some embodiments, the second masking structure 1406 may comprise a photosensitive material (e.g., a photoresist). In some embodiments, the second etchant 1404 may comprise a dry etchant (e.g., having a fluorine chemistry, a chlorine chemistry, or the like). In other embodiments, the second etchant 1404 may comprise a wet etchant (e.g., comprising hydrofluoric acid, potassium hydroxide, or the like).

Figure 15:
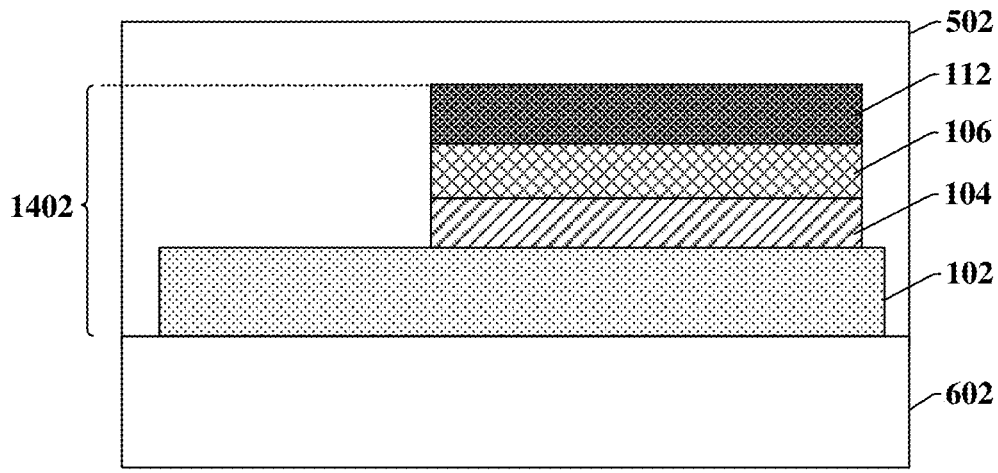

As shown in cross-sectional view 1500 of FIG. 15, a dielectric layer 502 is formed over the FeFET stack 1402. The dielectric layer 502 extends along an upper surface and sidewalls of the FeFET stack 1402. In various embodiments, the dielectric layer 502 may be formed by way of one or more deposition processes (e.g., ALD processes, CVD processes, PE-CVD processes, or the like).

Figure 16:
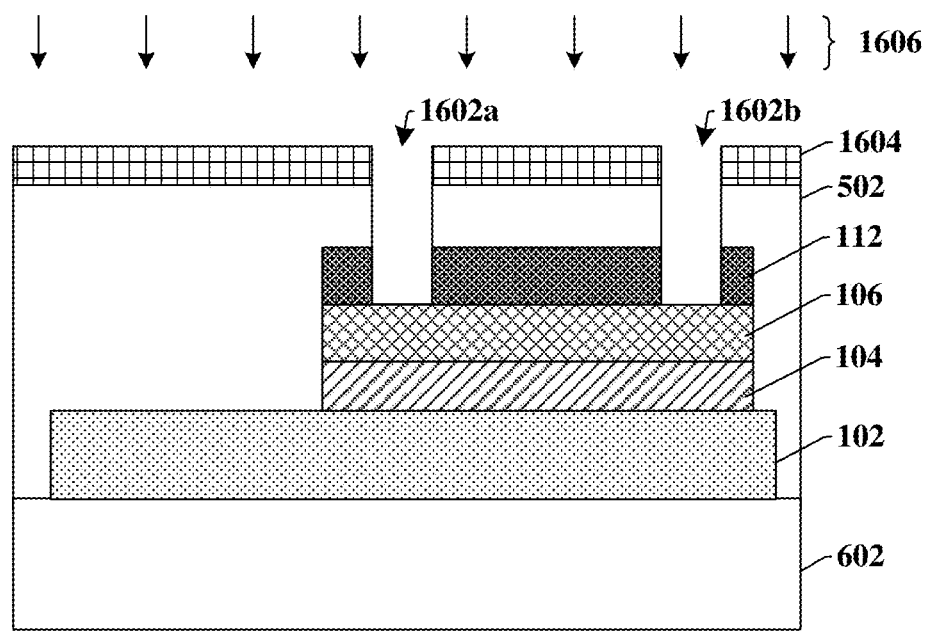

As shown in cross-sectional view 1600 of FIG. 16, a third patterning process is performed to pattern the dielectric layer 502 and to form a source contact hole 1602*a* and a drain contact hole 1602*b*. In some embodiments, the source contact hole 1602*a* and the drain contact hole 1602*b* extend through the dielectric layer 502 and the polarization enhancement structure 112 to expose upper surfaces of the oxide semiconductor 1106. In some embodiments, the third patterning process is performed by selectively exposing the dielectric layer 502 to a third etchant 1606 according to a third masking structure 1604. In some embodiments, the third etchant 1606 may comprise a dry etchant (e.g., having a fluorine chemistry, a chlorine chemistry, or the like).

Figure 17:
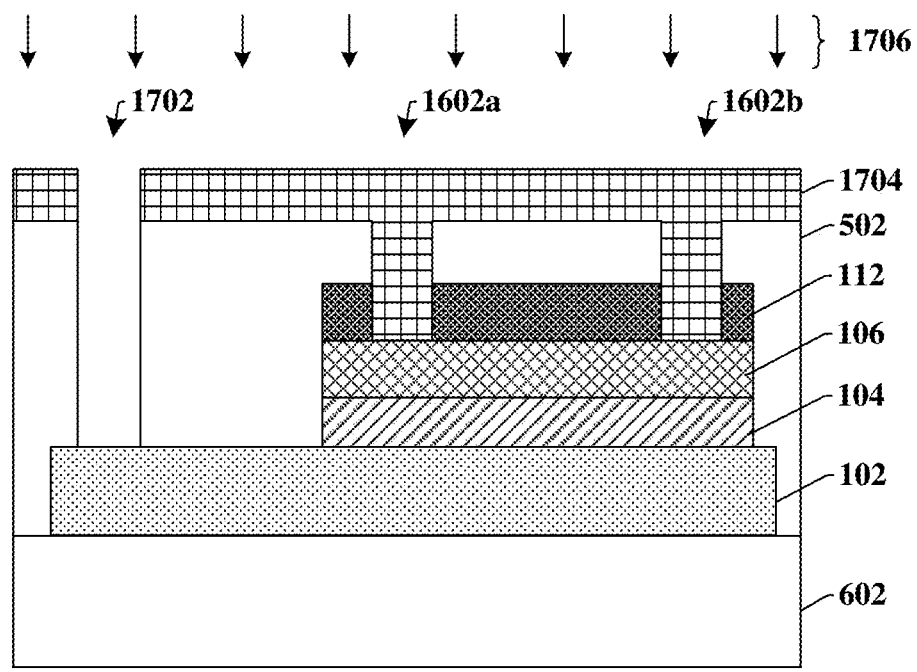

As shown in cross-sectional view 1700 of FIG. 17, a fourth patterning process is performed to pattern the dielectric layer 502 and to form a gate contact hole 1702. In some embodiments, the fourth patterning process is performed by selectively exposing the dielectric layer 502 to a fourth etchant according to a fourth masking structure 1704. In some embodiments, the fourth etchant 1706 may comprise a dry etchant (e.g., having a fluorine chemistry, a chlorine chemistry, or the like). In some alternative embodiments (not shown), the source contact hole 1602*a*, the drain contact hole 1602*b*, and the gate contact hole 1702 may be formed using a same patterning process. In such embodiments, the source contact hole 1602*a*, the drain contact hole 1602*b*, and the gate contact hole 1702 may be concurrently formed.

Figure 18:
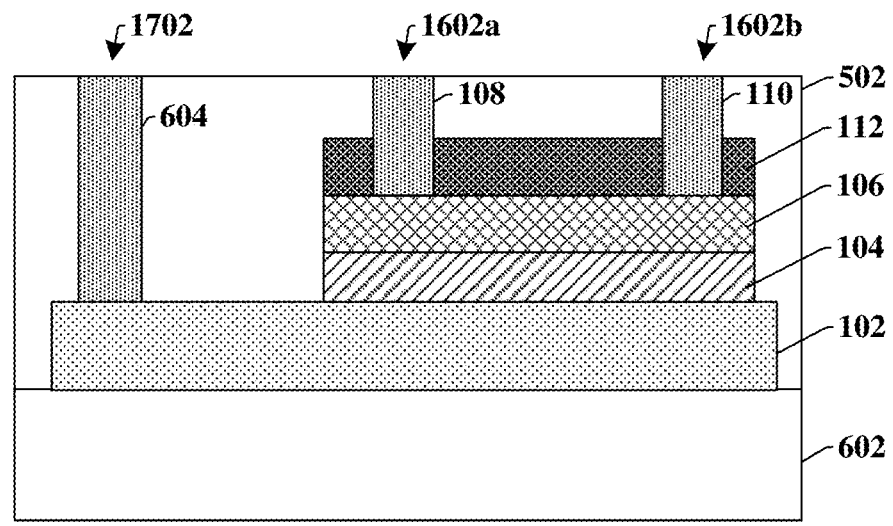

As shown in cross-sectional view 1800 of FIG. 18, a conductive material is formed within the source contact hole 1602*a*, the drain contact hole 1602*b*, and the gate contact hole 17702. In some embodiments, the conductive material may comprise a metal, such as copper, tungsten, cobalt, or the like. In some embodiments the conductive material may be deposited by one or more of a deposition process and a plating process. In some embodiments, a deposition process may be used to form a seed layer of a conductive material followed by a plating process to fill in the source contact hole 1602*a*, the drain contact hole 1602*b*, and the gate contact hole 1702. In some embodiments, after formation of the conductive material, a planarization process may be performed to remove excess of the conductive material from over the dielectric layer and to form a source region 108, a drain region 110, and a gate contact 604.

Figure 19:
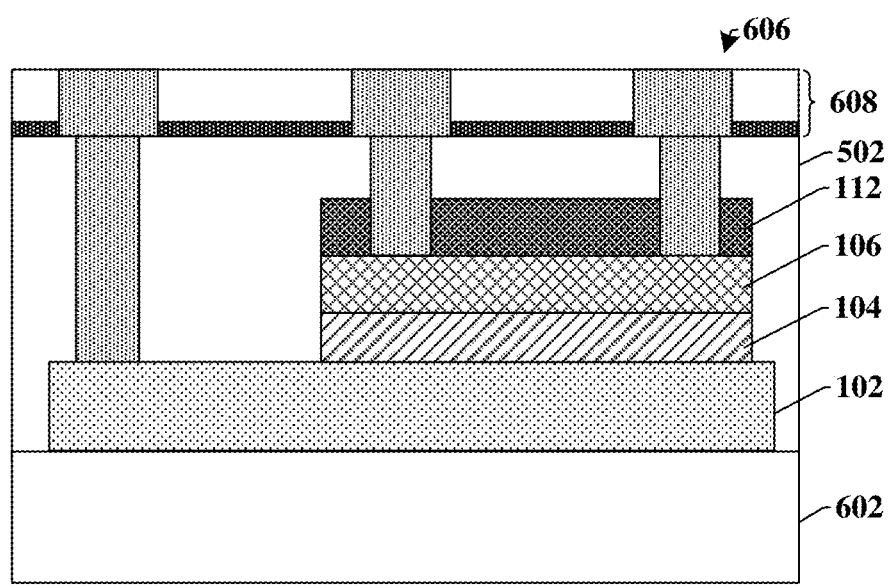

As shown in cross-sectional view 1900 of FIG. 19, one or more additional interconnects 606 may be formed within an inter-level dielectric (ILD) structure 608 disposed over the dielectric layer 502. In some embodiments, the one or more additional interconnects 606 may comprise one or more of a BEOL (back end of the line) interconnect, a MEOL (middle end of the line) interconnect, a conductive contact, and an interconnect wire. In some embodiments, the one or more additional interconnects may be formed by way of a damascene process (e.g., a single damascene process or a dual damascene process).

Figure 20:
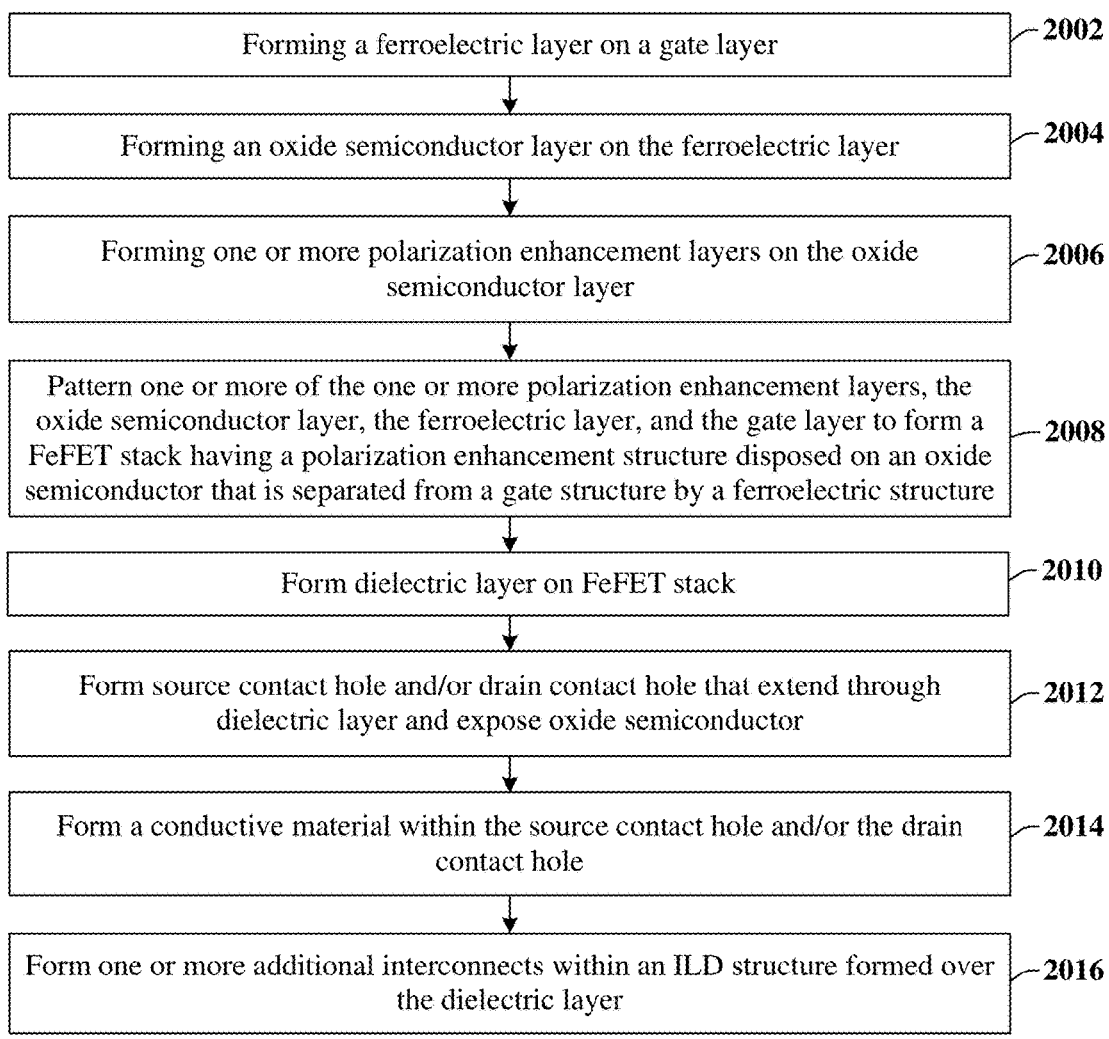
FIG. 20 illustrates a flow diagram of some embodiments of a method of forming an integrated chip comprising a FeFET device having a polarization enhancement structure.

FIG. 20 illustrates a flow diagram of some embodiments of a method 2000 of forming an integrated chip comprising a FeFET device having a polarization enhancement structure.

While the disclosed method 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a ferroelectric layer is formed on a gate layer. FIG. 10 illustrates a cross-sectional view 1000 of some embodiments corresponding to act 2002.

At act 2004, an oxide semiconductor layer is formed on the ferroelectric layer. The oxide semiconductor layer has a first type of semiconductor (e.g., an n-type semiconductor, which has electrons as a majority carrier). FIG. 11 illustrates a cross-sectional view 1100 of some embodiments corresponding to act 2004.

At act 2006, one or more polarization enhancement layers are formed on the oxide semiconductor layer. The one or more polarization enhancement layers have a second type of semiconductor (e.g., a p-type semiconductor, which has holes as a majority carrier) that is different than the first type of semiconductor. FIG. 12 illustrates a cross-sectional view 1200 of some embodiments corresponding to act 2006.

At act 2008, one or more of the one or more polarization enhancement layers, the oxide semiconductor layer, the ferroelectric layer, and the gate layer are patterned to form a FeFET stack having a ferroelectric structure between a gate structure and an oxide semiconductor. FIGS. 13-14 illustrate cross-sectional views 1300-1400 of some embodiments corresponding to act 2008.

At act 2010, a dielectric layer is formed over the FeFET stack. FIG. 15 illustrates a cross-sectional view 1500 of some embodiments corresponding to act 2010.

At act 2012, one or more additional patterning processes are performed to form a source contact hole and/or a drain contact hole that extend through the dielectric layer and expose the oxide semiconductor. FIG. 16 illustrates a cross-sectional view 1600 of some embodiments corresponding to act 2012.

At act 2014, a conductive material is formed within the source contact hole and/or the drain contact hole. FIG. 18 illustrates a cross-sectional view 1800 of some embodiments corresponding to act 2014.

At act 2016, one or more additional interconnects are formed within an ILD structure formed over the dielectric layer. FIG. 19 illustrates a cross-sectional view 1900 of some embodiments corresponding to act 2016.

Accordingly, in some embodiments, the present disclosure relates to an integrated chip comprising a ferroelectric field-effect transistor (FeFET) device having a polarization enhancement structure disposed over an oxide semiconductor configured to act as a channel. The oxide semiconductor has a first semiconductor type (e.g., n-type or p-type) that is different than that of a second semiconductor type (e.g., p-type or n-type) of the polarization enhancement structure.

In some embodiments, the present disclosure relates to a ferroelectric field-effect transistor (FeFET) device. The FeFET device includes a ferroelectric structure having a first side and a second side; a gate structure disposed along the first side of the ferroelectric structure; an oxide semiconductor disposed along the second side of the ferroelectric structure and having a first semiconductor type; a source region and a drain region disposed on the oxide semiconductor, the gate structure being laterally between the source region and the drain region; and a polarization enhancement structure arranged on the oxide semiconductor between the source region and the drain region and including a semiconductor material or an oxide semiconductor material having a second semiconductor type that is different than the first semiconductor type. In some embodiments, the FeFET device further includes a dielectric layer disposed on the polarization enhancement structure, the source region and the drain region extending through the dielectric layer and the polarization enhancement structure. In some embodiments, the first semiconductor type is an n-type semiconductor and the second semiconductor type is a p-type semiconductor. In some embodiments, the polarization enhancement structure is arranged along opposing sides of the source region and along opposing sides of the drain region. In some embodiments, the oxide semiconductor includes one or more of indium gallium zinc oxide, indium gallium zinc tin oxide, indium tungsten oxide, indium tungsten zinc oxide, indium zinc oxide, and zinc oxide. In some embodiments, the polarization enhancement structure has an uppermost surface that continuously extends between a first sidewall of the source region and a second sidewall of the drain region. In some embodiments, the source region is coupled to a source-line, the drain region is coupled to a bit-line, and the gate structure is coupled to a word-line. In some embodiments, the FeFET device further includes a dielectric layer disposed on an upper surface of the gate structure, the upper surface of the gate structure continuously extending from directly below the ferroelectric structure to laterally outside of the ferroelectric structure; and a gate contact extending through the dielectric layer to contact the gate structure. In some embodiments, the gate structure is disposed along a first side of a substrate, the gate structure is vertically disposed between the first side of the substrate and the ferroelectric structure. In some embodiments, the FeFET device further includes a transistor device arranged along the first side of the substrate. In some embodiments, the polarization enhancement structure continuously extends for a first width along a cross-sectional view extending through the source region and the drain region, wherein the oxide semiconductor continuously extends over a second width as viewed along the cross-sectional view, the second width being larger than the first width.

In other embodiments, the present disclosure relates to an integrated chip. The integrated chip includes a gate structure arranged over a substrate; a ferroelectric structure arranged on the gate structure; an oxide semiconductor separated from the gate structure by the ferroelectric structure and having a first semiconductor type; a source region disposed on the oxide semiconductor; and a polarization enhancement structure arranged on the oxide semiconductor and having a second semiconductor type that is different than the first semiconductor type. In some embodiments, the source region is a metal. In some embodiments, the integrated chip further includes a drain region disposed on the oxide semiconductor, an uppermost surface of the polarization enhancement structure continuously extending between sidewalls of the source region and the drain region. In some embodiments, the gate structure includes a material having a Fermi level that is between a Fermi level of the oxide semiconductor and a Fermi level of the polarization enhancement structure. In some embodiments, the oxide semiconductor and the polarization enhancement structure respectively have a doping concentration of less than approximately $1\times10^{18}$ at/cm$^{-3}$.

In other embodiments, the present disclosure relates to a method of forming a FeFET device. The method includes forming a FeFET stack having a polarization enhancement structure disposed on an oxide semiconductor that is separated from a gate structure by a ferroelectric structure, the oxide semiconductor having a different semiconductor type than the polarization enhancement structure; forming a dielectric layer on the polarization enhancement structure; performing a first patterning process to form a source opening exposing the oxide semiconductor; and forming a conductive material within the source opening. In some embodiments, the method further includes performing a planarization process to remove excess of the conductive material from over the dielectric layer. In some embodiments, the oxide semiconductor includes an n-type semiconductor and the polarization enhancement structure includes a p-type semiconductor. In some embodiments, the oxide semiconductor includes indium gallium zinc oxide, indium gallium zinc tin oxide, indium tungsten oxide, indium tungsten zinc oxide, indium zinc oxide, or zinc oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FeFET device, comprising:
   forming a FeFET stack comprising a polarization enhancement structure disposed on an oxide semiconductor that is separated from a gate structure by a ferroelectric structure, wherein the polarization enhancement structure comprises a semiconductor, and wherein the oxide semiconductor has a different semiconductor type than the polarization enhancement structure;
   forming a dielectric layer on the polarization enhancement structure;
   performing a first patterning process to form a source opening and a drain opening that extend through the polarization enhancement structure to expose the oxide semiconductor; and
   forming a conductive material within the source opening and the drain opening.

2. The method of claim 1, further comprising:
   performing a planarization process to remove excess of the conductive material from over the dielectric layer and to define a source region within the source opening and a drain region within the drain opening.

3. The method of claim 1, wherein the oxide semiconductor comprises an n-type semiconductor and the polarization enhancement structure comprises a p-type semiconductor.

4. The method of claim 1, wherein the oxide semiconductor comprises indium gallium zinc oxide, indium gallium zinc tin oxide, indium tungsten oxide, indium tungsten zinc oxide, indium zinc oxide, or zinc oxide.

5. The method of claim 2, wherein the polarization enhancement structure has an uppermost surface that continuously extends between the source opening and the drain opening.

6. The method of claim 2, wherein the source region is coupled to a source-line, the drain region is coupled to a bit-line, and the gate structure is coupled to a word-line.

7. The method of claim 2, wherein the gate structure continuously extends from directly below the ferroelectric structure to laterally outside of the ferroelectric structure.

8. The method of claim 2, further comprising:
   forming a gate opening that extends through the dielectric layer to expose an upper surface of the gate structure; and
   forming a gate contact within the gate opening.

9. The method of claim 2,
   wherein the polarization enhancement structure continuously extends for a first width along a cross-sectional view extending through the source region and the drain region; and
   wherein the oxide semiconductor continuously extends over a second width as viewed along the cross-sectional view, the second width being larger than the first width.

10. A method of forming a FeFET device, comprising:
    forming a gate layer over a substrate;
    forming a ferroelectric layer over the gate layer;
    forming an oxide semiconductor layer over the ferroelectric layer;
    forming a polarization enhancement layer over the oxide semiconductor layer;
    performing a first patterning process on the polarization enhancement layer, the oxide semiconductor layer, and the ferroelectric layer to form an oxide semiconductor between a ferroelectric structure and a polarization enhancement structure;
    performing a second patterning process on the gate layer to form a gate structure;
    forming a dielectric layer over the gate structure and the polarization enhancement structure; and
    forming a source region and a drain region extending through the dielectric layer and the polarization enhancement structure to contact the oxide semiconductor.

11. The method of claim 10, wherein the polarization enhancement layer comprises doped silicon or doped germanium.

12. The method of claim 10, wherein the oxide semiconductor layer comprises a first type of semiconductor and the polarization enhancement layer comprises a second type of semiconductor that is different than the first type of semiconductor.

13. The method of claim 10, wherein the second patterning process is performed after the first patterning process is completed.

14. The method of claim 10, wherein forming the source region and the drain region comprises:
    etching through the dielectric layer and the polarization enhancement layer to form a source opening and a drain opening; and
    forming a conductive material within the source opening and the drain opening.

15. The method of claim 10, wherein the gate structure comprises a material having a Fermi level that is between a Fermi level of the oxide semiconductor and a Fermi level of the polarization enhancement structure.

16. A method of forming a FeFET device, comprising:
    forming a ferroelectric layer on a gate layer;
    forming an oxide semiconductor layer on the ferroelectric layer, the oxide semiconductor layer having a first semiconductor type;
    forming a polarization enhancement layer on the oxide semiconductor layer, the polarization enhancement layer comprising a semiconductor material having a second semiconductor type that is different than the first semiconductor type;
    patterning the polarization enhancement layer, the oxide semiconductor layer, and the ferroelectric layer to form an oxide semiconductor between a ferroelectric structure and a polarization enhancement structure; and
    forming a source region and a drain region extending through the polarization enhancement structure to contact the oxide semiconductor.

17. The method of claim 16, wherein the polarization enhancement structure comprises a gradient doping concentration that decreases from a lower surface of the polarization enhancement structure facing the oxide semiconductor to an upper surface of the polarization enhancement structure facing away from the oxide semiconductor.

18. The method of claim 16, further comprising:
    forming a dielectric layer over and along sidewalls of the polarization enhancement structure, the oxide semiconductor, and the ferroelectric structure;
    etching the dielectric layer to form a source opening and a drain opening; and
    forming the source region within the source opening and the drain region within the drain opening.

19. The method of claim 16, further comprising:
    patterning the gate layer to form a gate structure after patterning the ferroelectric layer, wherein the gate structure has a greater maximum width than the ferroelectric structure.

20. The method of claim 16, further comprising:
    forming a contact etch stop layer to cover opposing outermost sidewalls of the ferroelectric structure, the oxide semiconductor, and the polarization enhancement structure, as viewed in a cross-sectional view.

\* \* \* \* \*